United States Patent
Sohn et al.

(10) Patent No.: US 9,831,003 B2
(45) Date of Patent: Nov. 28, 2017

(54) DEVICE AND METHOD FOR REPAIRING MEMORY CELL AND MEMORY SYSTEM INCLUDING THE DEVICE

(71) Applicant: Samsung Electronics Co., Ltd., Suwon-si (KR)

(72) Inventors: Kyo-Min Sohn, Yongin-si (KR); Ho-Young Song, Hwaseong-si (KR); Sang-Joon Hwang, Suwon-si (KR); Cheol Kim, Seoul (KR); Dong-Hyun Sohn, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/498,855

(22) Filed: Apr. 27, 2017

(65) Prior Publication Data
US 2017/0229192 A1    Aug. 10, 2017

Related U.S. Application Data

(60) Continuation of application No. 14/698,219, filed on Apr. 28, 2015, now Pat. No. 9,659,669, which is a
(Continued)

(51) Int. Cl.
*G11C 29/44* (2006.01)
*G11C 29/56* (2006.01)
(Continued)

(52) U.S. Cl.
CPC ...... *G11C 29/4401* (2013.01); *G11C 11/4078* (2013.01); *G11C 11/4094* (2013.01);
(Continued)

(58) Field of Classification Search
CPC ..... G11C 29/44; G11C 29/56; G11C 29/4401; G11B 20/1816; G01R 31/3187; G06F 11/27
(Continued)

(56) References Cited

U.S. PATENT DOCUMENTS 4,480,307 A * 10/1984 Budde ................. G06F 13/1615
710/100
4,627,053 A * 12/1986 Yamaki .................. G11C 29/72
714/711
(Continued)

FOREIGN PATENT DOCUMENTS

JP    2001352038    12/2001
JP    2006186247    7/2006
(Continued)

OTHER PUBLICATIONS

Japanese OA issued in SAM-1598DIV/corresponding Japanese Application No. 2013-036931 dated Oct. 6, 2015.
(Continued)

*Primary Examiner* — Joseph D Torres
(74) *Attorney, Agent, or Firm* — Onello & Mello LLP

(57) ABSTRACT

Provided are a method and an apparatus for repairing a memory cell in a memory test system. A test device detects a fail address by testing a memory device according to a test command, and temporarily stores the fail address in a fail address memory (FAM). The fail address is transmitted to the memory device according to a fail address transmission mode, is temporarily stored in a temporary fail address storage of the memory device, and is then stored in an anti-fuse array, which is a non-volatile storage device. To secure the reliability of data, stored data can be read to verify the data and a verification result can be transmitted in series or in parallel to the test device.

20 Claims, 23 Drawing Sheets

Related U.S. Application Data division of application No. 13/753,165, filed on Jan. 29, 2013, now Pat. No. 9,087,613.

(60) Provisional application No. 61/604,570, filed on Feb. 29, 2012.

(51) Int. Cl.

| | | |
|---|---|---|
| *G11B 20/18* | (2006.01) | |
| *G01R 31/3187* | (2006.01) | |
| *G06F 11/27* | (2006.01) | |
| *G11C 29/36* | (2006.01) | |
| *G11C 29/42* | (2006.01) | |
| *G11C 11/4094* | (2006.01) | |
| *G11C 11/4096* | (2006.01) | |
| *G11C 11/4078* | (2006.01) | |
| *G11C 17/16* | (2006.01) | |
| *G11C 17/18* | (2006.01) | |
| *G11C 29/00* | (2006.01) | |

(52) U.S. Cl.
CPC .......... *G11C 11/4096* (2013.01); *G11C 17/16* (2013.01); *G11C 17/18* (2013.01); *G11C 29/36* (2013.01); *G11C 29/42* (2013.01); *G11C 29/78* (2013.01)

(58) Field of Classification Search
USPC ........................................ 714/723, 733, 710
See application file for complete search history.

(56) References Cited

U.S. PATENT DOCUMENTS

| | | | | | |
|---|---|---|---|---|---|
| 4,942,556 | A * | 7/1990 | Sasaki | ................... | G11C 15/04 365/168 |
| 5,313,424 | A * | 5/1994 | Adams | ................... | G11C 29/44 365/200 |
| 5,357,473 | A * | 10/1994 | Mizuno | ................ | G11C 29/822 365/200 |
| 5,586,075 | A * | 12/1996 | Miwa | ..................... | G11C 29/82 365/185.29 |
| 5,724,282 | A * | 3/1998 | Loughmiller | .......... | G11C 17/16 365/200 |
| 5,751,627 | A * | 5/1998 | Ooishi | .................... | G11C 11/22 365/145 |
| 5,808,944 | A * | 9/1998 | Yoshitake | ............... | G11C 29/80 365/185.09 |
| 5,808,945 | A * | 9/1998 | Arase | ..................... | G11C 29/81 365/200 |
| 5,815,449 | A * | 9/1998 | Taura | ..................... | G11C 29/84 365/189.07 |
| 5,867,504 | A * | 2/1999 | Pascucci | ................ | G11C 29/78 714/711 |
| 5,917,833 | A * | 6/1999 | Sato | .................. | G01R 31/31935 365/201 |
| 5,920,515 | A * | 7/1999 | Shaik | ..................... | G11C 29/84 365/200 |
| 5,983,374 | A * | 11/1999 | Todome | ................. | G11C 29/72 714/711 |
| 5,987,632 | A * | 11/1999 | Irrinki | .................... | G11C 29/44 365/201 |
| 6,157,585 | A * | 12/2000 | Kim | ........................ | G11C 11/22 365/145 |
| 6,370,661 | B1 * | 4/2002 | Miner | ..................... | G11C 29/12 714/31 |
| 6,370,665 | B1 * | 4/2002 | Noguchi | .......... | G01R 31/31854 714/718 |
| 6,388,929 | B1 * | 5/2002 | Shimano | ................. | G11C 29/44 365/200 |
| 6,480,978 | B1 * | 11/2002 | Roy | ................. | G01R 31/31905 714/724 |
| 6,499,121 | B1 * | 12/2002 | Roy | ................. | G01R 31/31905 714/718 |
| 6,538,924 | B2 * | 3/2003 | Dono | ..................... | G11C 14/00 365/185.08 |
| 6,542,419 | B2 * | 4/2003 | Hasegawa | ............ | G11C 29/785 365/189.05 |
| 6,552,960 | B2 * | 4/2003 | Shirai | ....................... | G11C 7/20 365/189.05 |
| 6,639,857 | B2 * | 10/2003 | Kang | ..................... | G11C 29/789 365/185.09 |
| 6,646,930 | B2 * | 11/2003 | Takeuchi | ................ | G11C 16/20 365/200 |
| 6,651,204 | B1 * | 11/2003 | Rajsuman | ......... | G01R 31/31915 714/738 |
| 6,721,920 | B2 * | 4/2004 | Rearick | ............... | G01R 31/3187 324/617 |
| 6,862,704 | B1 * | 3/2005 | Miner | ..................... | G11C 29/12 714/31 |
| 6,865,706 | B1 * | 3/2005 | Rohrbaugh | ....... | G01R 31/31837 714/728 |
| 6,993,692 | B2 * | 1/2006 | Ouellette | ................ | G11C 29/44 714/5.11 |
| 7,174,477 | B2 * | 2/2007 | Derner | ................. | G11C 29/822 714/6.2 |
| 7,382,680 | B2 | 6/2008 | Nakano et al. | | |
| 7,392,443 | B2 * | 6/2008 | Braun | ..................... | G11C 29/12 365/201 |
| 7,546,506 | B2 * | 6/2009 | Sonoda | ................... | G11C 29/48 714/736 |
| 7,693,223 | B2 * | 4/2010 | Kishigami | ........ | G01R 31/31922 375/224 |
| 7,694,196 | B2 * | 4/2010 | Schnell | .................. | G11O 5/04 714/42 |
| 7,734,966 | B1 * | 6/2010 | Lee | ................... | G11C 29/12015 365/201 |
| 7,877,649 | B2 * | 1/2011 | Kliewer | ............... | G11C 29/1201 714/42 |
| 2002/0062466 | A1 * | 5/2002 | Noguchi | .......... | G01R 31/31854 714/738 |
| 2002/0159310 | A1 * | 10/2002 | Park | ....................... | G11C 29/72 365/200 |
| 2003/0226074 | A1 * | 12/2003 | Ohlhoff | .................... | G11C 29/56 714/718 |
| 2004/0013028 | A1 * | 1/2004 | Lim | ...................... | G11C 29/816 365/244 |
| 2004/0061516 | A1 * | 4/2004 | Murata | ........... | G01R 31/318505 324/750.3 |
| 2004/0138845 | A1 * | 7/2004 | Park | ................. | G01R 31/31835 702/108 |
| 2004/0218431 | A1 * | 11/2004 | Chung | ................... | G11C 29/783 365/200 |
| 2005/0166111 | A1 * | 7/2005 | Chien | .................... | G11C 29/38 714/733 |
| 2005/0289415 | A1 * | 12/2005 | Dean | ................. | G01R 31/2886 714/724 |
| 2006/0064261 | A1 * | 3/2006 | Boldt | ....................... | G11C 29/48 702/80 |
| 2006/0092725 | A1 * | 5/2006 | Min | ........................ | G11C 29/787 365/200 |
| 2007/0070743 | A1 * | 3/2007 | Do | ......................... | G11C 29/26 365/201 |
| 2007/0136640 | A1 * | 6/2007 | Jarrar | ................... | G11C 11/005 714/763 |
| 2007/0255981 | A1 * | 11/2007 | Eto | ...................... | G06F 11/1008 714/710 |
| 2008/0065929 | A1 * | 3/2008 | Nadeau-Dostie | .. | G11C 29/4401 714/5.11 |
| 2008/0191990 | A1 * | 8/2008 | Matsubara | ............... | G09G 3/20 345/98 |
| 2009/0085599 | A1 * | 4/2009 | Choi | ................... | G01R 31/2884 324/750.27 |
| 2010/0271897 | A1 * | 10/2010 | Naritake | ................ | G11C 17/16 365/225.7 |
| 2010/0290299 | A1 * | 11/2010 | Matsumoto | ............ | G11C 29/44 365/200 |

(56) References Cited

U.S. PATENT DOCUMENTS

| | | | | |
|---|---|---|---|---|
| 2011/0051538 A1* | 3/2011 | Lunde | ................... | G11C 29/76 |
| | | | | 365/200 |
| 2014/0078842 A1* | 3/2014 | Oh | ...................... | G11C 29/785 |
| | | | | 365/200 |
| 2014/0146624 A1 | 5/2014 | Son et al. | | |

FOREIGN PATENT DOCUMENTS

| | | |
|---|---|---|
| JP | 2007109359 | 4/2007 |
| WO | 0156038 | 8/2001 |
| WO | 2011081846 | 7/2011 |

OTHER PUBLICATIONS

"Device and Method for Repairing Memory Cell and Memory System Including the Device" Specification, Drawings, and Prosecution History, of U.S. Appl. No. 14/698,219, filed Apr. 28, 2015, by Kyo-Min Sohn, et al.

\* cited by examiner

FIG. 13

| Case | Verification Result ||| Description |
|---|---|---|---|---|
| | DQ0 | DQ1 | DQ2 | |
| 1 | Low | Low | Low | OK (fail bit is replaced by row redundant cells) |
| 2 | Low | Low | High | OK (fail bit is replaced by column redundant cells) |
| 3 | Low | High | Low | OK (fail bit is replaced by single redundant cell) |
| 4 | Low | High | High | RFU (reservde for future use) |
| 5 | High | Low | Low | Fail (rupture process had some problems) |
| 6 | High | Low | High | Fail (rupture process is still in progress) |
| 7 | High | High | Low | Fail (there is no available redundant cell) |
| 8 | High | High | High | This chip is not selected for repair process |

FIG. 15

Case1 (LLL): OK (fail bit is replaced by row redundant cells)

|     | 1st | 2nd | 3rd | 4th | 5th | 6th | 7th | 8th |
|-----|-----|-----|-----|-----|-----|-----|-----|-----|
| DQ0 | Low | Low | Low | High | High | High | High | High |
| DQ1 | Low | Low | Low | High | High | High | High | High |
| DQ2 | Low | Low | Low | High | High | High | High | High |
| DQ3 | Low | Low | Low | High | High | High | High | High |

Case6 (HLH): Fail (rupture process is still in progress)

|     | 1st | 2nd | 3rd | 4th | 5th | 6th | 7th | 8th |
|-----|-----|-----|-----|-----|-----|-----|-----|-----|
| DQ0 | High | Low | High | High | High | High | High | High |
| DQ1 | High | Low | High | High | High | High | High | High |
| DQ2 | High | Low | High | High | High | High | High | High |
| DQ3 | High | Low | High | High | High | High | High | High |

DEVICE AND METHOD FOR REPAIRING MEMORY CELL AND MEMORY SYSTEM INCLUDING THE DEVICE

CROSS-REFERENCE TO RELATED APPLICATION

This application is a Continuation application of U.S. patent application Ser. No. 14/698,219, filed Apr. 28, 2015, which is a Divisional application of U.S. patent application Ser. No. 13/753,165, filed Jan. 29, 2013, which claims the benefit of Provisional U.S. patent application Ser. No. 61/604,570, filed Feb. 29, 2012, the entire contents of which are incorporated herein by reference in their entirety.

FIELD OF INVENTION

The inventive concept relates to a memory device test system, and more particularly, to a method and apparatus for repairing a memory cell of a memory device including a non-volatile storage device, and a system including the memory device.

BACKGROUND

A semiconductor chip is manufactured according to a semiconductor manufacturing process, and is then tested in the form of a wafer, die, or package using test equipment. Through the test, a defective portion or a defective chip may be sorted out. When some memory cells of a semiconductor chip are defective, the semiconductor chip is fixed by restoring such defective memory cells.

Recently, as a process of manufacturing a semiconductor chip, such as a dynamic random access memory (DRAM), has become increasingly refined. In such cases, features of the chip are generally smaller and more tightly integrated, such that errors are much more likely to occur during the manufacture process. Also, even if no error is detected during an initial test period, an error may occur during an operation of a chip. To solve this problem, various test methods and devices have been developed.

SUMMARY

In accordance with aspects of the inventive concept, provided is a test device for reliably repairing a memory cell, a test method for reliably repairing a memory cell, and a memory test system including a test device and method for reliably repairing a memory cell.

In accordance with an aspect of the inventive concept, a memory system comprising a memory device including a memory cell array and a non-volatile memory (NVM) storage array and a test device configured to determine a fail address of the memory cell array and to transmit the fail address to the memory device for storage in the NVM storage array.

The test device may form at least part of a system-on-chip (SOC).

The NVM storage array may comprise an anti-fuse array, wherein the anti-fuse array may be an m×n array, and wherein m and n are each at least 2.

The test device may comprise an error correcting code (ECC) engine configured to determine the fail address.

The test device may comprise a built-in-self-test (BIST) circuit configured to determine the fail address.

The test device may further comprise an ECC engine and the test device may be configured to determine the fail address using one of the BIST circuit and the ECC engine.

The test device may comprise a fail address memory (FAM) configured to temporarily store the fail address and a control unit configured to control storage of the fail address in the FAM and to output the fail address from the FAM to the memory device for storage in the non-volatile storage array.

The test device may comprise: at least one of an ECC engine and BIST circuit configured to determine the fail address; a fail address memory (FAM) configured to temporarily store the fail address; a control unit responsive to test commands from a CPU to control the at least one ECC engine and BIST circuit and storage of the fail address in the FAM; an address output circuit configured to output the fail address from the FAM to the memory device for storage in the non-volatile storage array in response to the control unit; and a data buffer configured to buffer data input and output to the memory device.

The test command from the CPU to the control unit may comprise one of a test start command, a test exit command, a fail address transmission start command, and a fail address transmission end command.

The test device may form part of a system-on-chip (SOC) that further comprises: a CPU and a memory controller responsive to test commands from the CPU, the memory controller comprising the test device and a fail address memory (FAM) configured to temporarily store the fail address.

The CPU may be configured to provide a test command to the memory controller to initiate a test of the memory device.

The test command from the CPU to the control unit may comprise one of a test start command, a test exit command, a fail address transmission start command, and a fail address transmission end command.

The test device may form at least part of a test equipment circuit or apparatus.

The test equipment may further comprise: socket configured to temporarily secure the memory device; a probe card configured to electrically interface to the memory device; and a pattern generator configured to generate various test data that are provided to test the memory device.

The NVM storage array may be an anti-fuse array.

The memory device may further comprise a temporary fail address storage (TFAS) device, which is configured for temporary storage of the fail address.

The memory device may further comprise a control unit coupled to the TFAS device and the NVM storage array.

The TFAS device may be configured to transfer the fail address to the NVM storage array in response to a mode enable signal provided by the control unit.

The control unit may be configured to sense the fail address stored in the NVM storage array, verify the fail address, and to transmit the fail address to the test device.

The memory device may further comprise a repair address register coupled to the NVM storage array; a comparing unit coupled to the repair address register and configured to compare the fail address with an external address; and a multiplexer coupled to the comparing unit and the memory cell array, the multiplexer configured to select one of the fail address and the external address based on a comparing result of the comparing unit.

The memory device may be a DRAM, a NAND flash device, PRAM device, or MRAM device.

In accordance with another aspect of the invention, provided is a memory device comprising: an array of memory cells configured for storing data; and a non-volatile memory (NVM) storage array configured for storing a fail address indicating a failed memory cell from the array of memory cells; a temporary fail address storage (TFAS) device, configured to temporarily store the fail address; and a control unit coupled to the TFAS device and the NVM storage array.

The non-volatile storage array may comprise an anti-fuse array, wherein the anti-fuse array is an m×n array, and wherein m and n are at least 2.

The control unit may be configured to verify the fail address.

The control unit may be configured to sense the fail address stored in the TFAS device and to program the fail address into the NVM storage array.

The memory device may further comprise a comparing unit configured to compare the fail address with an external address.

The memory device may further comprise an address buffer configured to receive the fail address and to temporarily store the fail address in the TFAS device.

The memory device may further comprise a decoding unit coupled to the control unit and configured to receive and decode a control signal and to generate a mode enable signal.

The memory device may further comprise an address buffer coupled to the TFAS device and configured to receive fail address and a control buffer coupled to the decoding unit and configured to receive the control signal.

The memory device may be a DRAM, a NAND flash device, PRAM device, or MRAM device.

According to another aspect of the present invention, provided is a test device comprising an error detecting circuit configured to determine a fail address of a failed memory cell of a memory device, a fail address memory (FAM) configured to store the fail address, and a control unit operatively coupled to the FAM to control the output of the fail address memory to the memory device in response to test commands.

The fail address memory may comprise a register, a static random access memory (SRAM), or a non-volatile memory.

The error detecting circuit may comprise an error correcting code (ECC) engine configured to determine the fail address.

The error detecting circuit may comprise a built-in-self-test (BIST) circuit configured to determine the fail address.

The test device may further comprise an ECC engine and the test device may be configured to determine the fail address using one of the BIST circuit and the ECC engine.

The test device may further comprise a data buffer circuit controlled by the control unit, and configured to receive and transmit data from and to the memory device, respectively.

The test command to the control unit may comprise one of a test start command, a test exit command, a fail address transmission start command, and a fail address transmission end command.

The test device may form part of a system-on-chip (SOC) that further comprises a CPU and a memory controller responsive to test commands from the CPU, the memory controller comprising the test device and the FAM.

The test device may form at least part of a test equipment circuit or apparatus.

The test equipment may further comprises a socket configured to temporarily secure the memory device, a probe card configured to electrically interface to the memory device, and a pattern generator configured to generate various test data that are provided to test the memory device.

The memory device may be a DRAM, a NAND flash device, PRAM device, or MRAM device.

According to another aspect of the invention, provided is a method of operating a test device. The method comprises determining a fail address using an error detecting circuit, storing the fail address in a fail address memory (FAM), and transmitting the fail address from the FAM to a memory device.

The fail address memory may comprise a register, a static random access memory (SRAM), or a non-volatile memory.

The error testing circuit may comprise an error correcting code (ECC) engine that performs the determining of the fail address.

The error testing circuit may comprise a built-in-self-test (BIST) circuit that performs the determining of the fail address.

The method may further comprise issuing one or more test commands to the test device from a CPU.

The one or more test commands may comprise one or more of a test start command, a test exit command, a fail address transmission start command, and a fail address transmission end command.

The method may further comprise, in response to a test command from the CPU, entering a fail address transmitting mode before transmitting the fail address from the FAM to the memory device.

The method claim may further comprise transmitting a control signal to the memory device, including transmitting a read command, a write command, a pre-charge command, and a mode register set command to the memory device, after the transmitting of the fail address from the FAM to the memory device.

The test device may form part of a system-on-chip (SOC) that further comprises a CPU and a memory controller responsive to test command from the CPU, the memory controller comprising the test device and the FAM.

The test device may form at least part of a test equipment comprising a test socket, a probe card, and a pattern generator.

The method may further comprise removably securing the memory device in the socket, electrically interfacing to the memory device using the probe card, and testing the memory device by providing various test data from the pattern generator to the memory device via the probe card.

The memory device may be a DRAM, a NAND flash device, PRAM device, or MRAM device.

According to another aspect of the invention, provided is a method of operating a memory device. The method comprises receiving a read command, a write command, a pre-charge command, a mode register set command, and a fail address from the fail address memory (FAM), storing the fail address in a temporary fail address storage (TFAS) device, entering a program mode, and checking a capacity of a non-volatile memory (NVM) storage array of the memory device, wherein the NVM comprises an anti-fuse array.

The method may further comprise programming the fail address to the NVM storage array.

The method may further comprise reading the programmed fail address from the NVM storage array and verifying the programmed fail address.

The method may further comprise sending a verification result to an external device.

The verification may be sent as parallel data.

The verification may be sent as serial data.

The method may further comprise replacing the fail bit memory cell with another memory cell of the memory device.

The memory device may be a DRAM, a NAND flash device, PRAM device, or MRAM device.

According to another aspect of the invention, provided is a method of testing a memory device. The method comprises testing the memory device using a test device, determining a fail address of a memory cell of a memory cell array of the memory device, and storing the fail address in a non-volatile memory (NVM) storage array of the memory device.

The NVM storage array may comprise an anti-fuse array, wherein the anti-fuse array may be an m×n array, and wherein m and n are each at least 2.

The test device may comprise an ECC engine and the method may include determining the fail address with the ECC engine.

The test device may comprise a BIST circuit and the method may include determining the fail address with the BIST circuit.

The test device and the memory device may form part of a system-on-chip (SOC).

The method may further comprise the test device: determining the fail address using an error testing circuit, storing the fail address in a fail address memory (FAM), transmitting the fail address from the FAM to the memory device, and transmitting a control signal to the memory device, including transmitting a read command, a write command, a pre-charge command, and a mode register set command to the memory device.

The method may further comprise the memory device receiving the read command, the write command, the pre-charge command, the mode register set command, and the fail address from the test device, storing the fail address in a temporary fail address storage (TFAS) device, entering a program mode, and checking a capacity of a NVM storage array.

The method may further comprise programming the fail address to the NVM storage array.

The method may further comprise reading the programmed fail address from the NVM storage array and verifying the programmed fail address.

The method may further comprise sending a verification result to an external device.

The verification may be sent as parallel data.

The verification may be sent as serial data.

The method may further comprise replacing the fail bit memory cell with another memory cell of the memory device.

The memory device may be a DRAM, a NAND flash device, PRAM device, or MRAM device.

According to another aspect of the invention, provided is a memory system of a mobile device. The memory system includes a memory device that comprises a memory cell array and a non-volatile memory (NVM) storage array and a built-in-self-test (BIST) circuit configured to determine a fail address of a memory cell of the memory cell array. The system further comprises a test device configured to transmit a test command to the memory device to cause the BIST circuit to determine the fail address.

The NVM storage array may comprise an anti-fuse array, wherein the anti-fuse array may be an m×n array, and wherein m and n are each at least 2.

The test device may be configured to transmit a fail address, a control signal, and a data signal to the memory device.

The memory device may further comprise a plurality of fail address memories (FAMs) configured to temporarily store the fail address.

The BIST circuit may be configured to transmit a fail flag and the fail address to at least one of the FAMs when the fail address is determined, wherein the fail address corresponds to a fail bit of a memory cell in the memory cell array.

The BIST circuit may be configured to store the fail address in at least one of the FAMs in response to a pre-charge command.

The memory device may be a DRAM, a NAND flash device, PRAM device, or MRAM device.

According to another aspect of the invention, provided is a method of operating a memory device, the memory device having a memory cell array, a non-volatile memory (NVM) storage array, a built-in-self-test (BIST) circuit, and at least one fail address memory (FAM). The method comprises receiving a test command and the BIST circuit: detecting a fail address of the memory cell array, wherein the fail address corresponds to a fail bit of a memory cell in the memory cell array, generating a fail flag; and transmitting the fail address and the fail flag to the at least one of the FAM. The method further comprises storing the fail address in the at least one FAM, entering a program mode, and programming the fail address to the NVM.

The method may further comprise checking the capacity of the NVM storage array, prior to programming the fail address to the NVM storage array.

The method may further comprise verifying the fail address stored in the NVM storage array.

The method may further comprise repairing the fail bit.

The memory device may be a DRAM, a NAND flash device, PRAM device, or MRAM device.

According to another aspect of the invention, provided is a memory system, comprising: at least one memory device comprising a memory cell array and a non-volatile memory (NVM) storage array, a memory controller comprising a test device configured to determine a fail address of the memory cell array and to transmit the fail address to the at least one memory device for storage in the NVM storage array, and at least one communication link coupled between the controller and the at least one memory device.

The NVM storage array may comprise an anti-fuse array, wherein the anti-fuse array may be an m×n array, and wherein m and n are each at least 2.

The test device may comprise an error correcting code (ECC) engine configured to determine the fail address.

The test device may comprise a built-in-self-test (BIST) circuit configured to determine the fail address.

The test device may further comprise an ECC engine and the test device may be configured to determine the fail address using one of the BIST circuit and the ECC engine.

The memory controller may include a control unit coupled to an electrical-to-optical (E/O) transmitting interface and an optical-to-electrical (O/E) receiving interface. The at least one memory device may include a memory core coupled to an electrical-to-optical (E/O) transmitting interface and an optical-to-electrical (O/E) receiving interface. And the at least one communication link may include a first optical link coupled between the controller E/O interface and the memory device O/E interface and a second optical link coupled between the controller O/E interface and the memory device E/O interface.

The communication link may be a bidirectional link.

The at least one memory device may comprise at least one memory chip and the memory controller may be part of an interface chip arranged in a stack with the at least one memory chip, wherein the at least one memory chip and interface chip are interconnected using micro-bump and through silicon via.

The controller may include a control unit having a multi-pin input/output (I/O) interface. The at least one memory device may include a memory core coupled to a multi-pin I/O interface. The at least one communication link may include a memory controller interface coupling pins of the control unit multi-pin I/O interface to corresponding pins of the memory device multi-pin I/O interface.

The memory controller interface may be configured to carry a command signal, a control signal, a memory address, a data strobe signal, and data between the controller and the at least one memory device.

The memory controller interface may be configured to carry a chip selection and address packet, and data between the controller and the at least one memory device.

The memory controller interface may be configured to carry a chip selection, address, and write data packet, and read data between the controller and the at least one memory device.

The memory controller interface may be configured to carry a command, address, and data packet, and a chip selection signal between the controller and the at least one memory device.

The memory system may form part of a computer system further comprising a user interface device, a CPU, and a bus connecting the CPU, user interface device, and the at least on memory device.

The CPU may include the test device.

The memory device may comprise a built-in-self-test (BIST) circuit.

The memory system may form part of a computer system, further comprising a user interface device, a CPU, a random access memory, a modem, and a bus connecting the CPU, user interface device, modem, and the memory controller.

The memory device may be a DRAM, a NAND flash device, PRAM device, or MRAM device.

BRIEF DESCRIPTION OF THE DRAWINGS

The inventive concept will be apparent from the description of exemplary embodiments and the accompanying drawings, in which like reference characters refer to the same parts throughout the different views. The drawings are not necessarily to scale, emphasis instead being placed upon illustrating the principles of the inventive concepts. In the drawings:

FIG. 13 is a table illustrating an exemplary embodiment of verification results to be transmitted in parallel, in accordance with aspects of the inventive concept;

FIG. 15 is a table illustrating an exemplary embodiment of verification results to be transmitted in series, in accordance with aspects of the inventive concept;

DETAILED DESCRIPTION OF THE EMBODIMENTS

Figure 1:
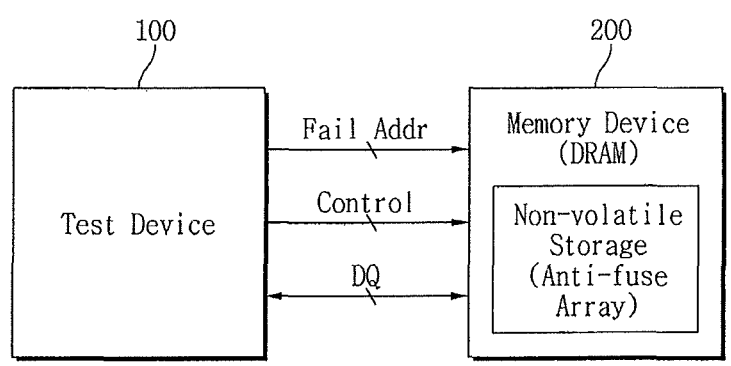
FIGS. 1 to 4 are conceptual diagrams of exemplary embodiments of memory test systems, in accordance with aspects of the inventive concept.

Various embodiments will now be described more fully with reference to the accompanying drawings. The inventive concept may, however, be embodied in different forms and should not be construed as limited to the embodiments set forth herein. Rather, these embodiments are provided so that this disclosure is thorough and complete and fully conveys the inventive concept to those skilled in the art. In the drawings, like reference numerals denote like elements, and the sizes and relative sizes of layers and regions may be exaggerated for clarity.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 4 are conceptual diagrams of embodiments of memory test systems in accordance with aspects of the inventive concept.

Referring to FIG. 1, a memory test system includes a test device 100 and a memory device 200. The test device 100 transmits a control signal including a fail address, a command with instruction to operate the memory device 200, and data DQ. Although not shown, the test device 100 may be included in a memory controller or a piece of test equipment. In this embodiment, the memory device 200 includes a dynamic random access memory (DRAM), which is a type volatile memory. Alternatively, the memory device 200 may include a non-volatile memory, e.g., a magneto-resistive RAM (MRAM), a resistive RAM (RRAM), a phase-change RAM (PRAM), or a NAND flash memory, as examples. In the presently preferred form, the memory device 200 includes a non-volatile storage device 280 including an anti-fuse array. The non-volatile storage device 280 is used to store the fail address. The memory device 200 operates according to the control signal, and transmits the data DQ to the test device 100.

Figure 2:
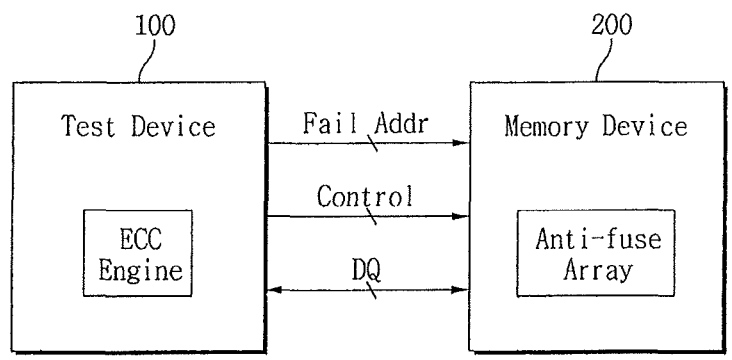

Referring to the embodiment of FIG. 2, an embodiment of the test device 100 may include an error correcting code (ECC) engine 120. The ECC engine 120 may be configured to detect a fail bit and a fail address from data DQ received from a memory device 200, and to correct the fail bit. The memory device 200 includes anti-fuse array 280, which stores the fail address received from the test device 100. A fail memory cell, from a memory array of the memory device 200, is repaired based on the stored fail address, as will be discussed below.

Figure 3:
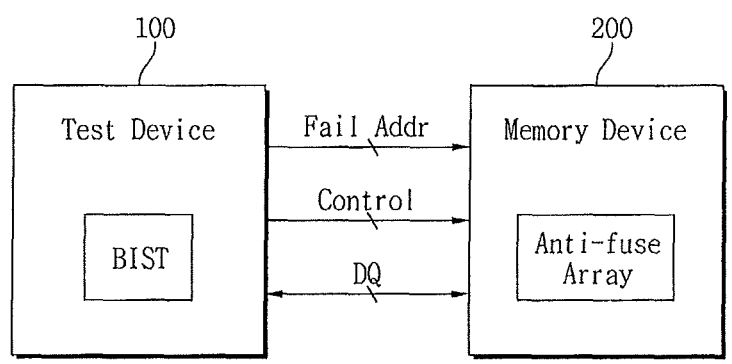

Referring to the embodiment of FIG. 3, an embodiment of the test device 100 may include a built-in self-test (BIST) unit 120. The BIST unit 120 may be configured to test the test device 100 or the memory device 200. To test the memory device 200, test data is generated and transmitted to the memory device 200. A fail memory cell is detected by writing the test data to a memory cell and then reading the test data from the memory cell. A fail address, that is the address of the fail memory cell, is temporarily stored in the test device 100 and is then transmitted to the memory device 200. The transmitted fail address is stored in the anti-fuse array 280, and subsequently used to repair the fail memory cell corresponding to the fail address.

Figure 4:
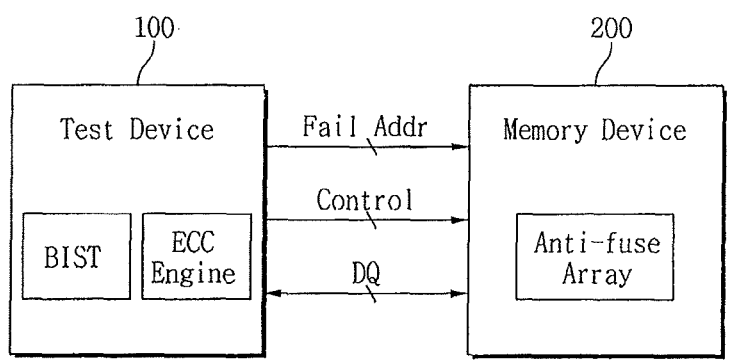

Referring to the embodiment of FIG. 4, an embodiment of the test device 100 may include a BIST unit and an ECC engine 120. A memory device 200 may be tested using the BIST unit and a fail address may be stored in the anti-fuse array 280 included in the memory device 200. The fail address, which is the address of a fail bit occurring during an operation of the memory device 200, is detected using the ECC engine 120, and is stored in the anti-fuse array of the memory device 200. When the memory device 200 does not operate, the memory device 200 may be tested by using the BIST unit according to a test command given from a central processing unit (CPU). While the memory device 200 operates, the fail address may be detected using the ECC engine.

Figure 5:
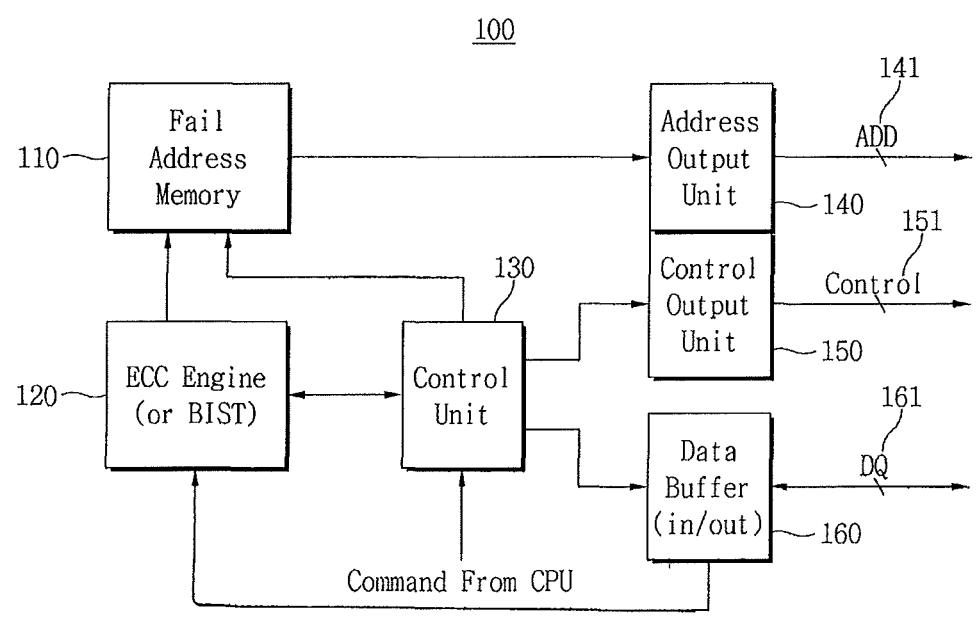
FIG. 5 illustrates an exemplary embodiment of a circuit block of a test device, in accordance with aspects of the inventive concept.

FIG. 5 illustrates a circuit block diagram of an embodiment of a test device 100, in accordance with aspects of the inventive concept.

Referring to the embodiment of FIG. 5, the test device 100 includes a fail address memory (FAM) 110, an ECC engine (and/or BIST unit) 120, a control unit 130, an address output buffer 140, a control output unit 150, and an input/output (I/O) data buffer 160. The fail address memory 110 stores a fail address ADD 141 detected by the ECC engine (or BIST unit) 120. The fail address memory 110 may be embodied as a register, a static random access memory (SRAM), or a non-volatile memory, as examples. The address output buffer 140 is connected to the fail address memory 110 and transmits the fail address ADD 141 to the memory device 200. The control output unit 150 transmits a control signal 151 including a read command, a write command, a precharge command, a mode register set (MRS) command, and the like, to the memory device 200. The control output unit 150 is connected to and is controlled by control unit 130. The I/O data buffer 160 is controlled by the control unit 130, and receives or transmits input/output (I/O) data. The I/O data may include only test data for testing the memory device 200.

Data received from the memory device 200 is transmitted to the ECC engine (and/or BIST unit) 120 via the I/O data buffer 160. The control unit 130 is connected to the ECC engine (and/or BIST unit) 120, the fail address memory 110, the address output unit 140, the control output buffer 150, and the I/O data buffer 160. The control unit 130 receives a test command from a CPU. The test command may be corresponded to a test start command, a test exit command, a command that instructs a start of transmission of the fail address ADD, and a command that instructs an end of the transmission of the fail address ADD. The fail address ADD 141 detected by the ECC engine (or BIST unit) 120 is controlled to be stored in the fail address memory 110, according to the received test command. Also, transmission of the fail address ADD 141 and the control signal 151 are controlled using the address output unit 140 and the control output unit 150.

Figure 6A:
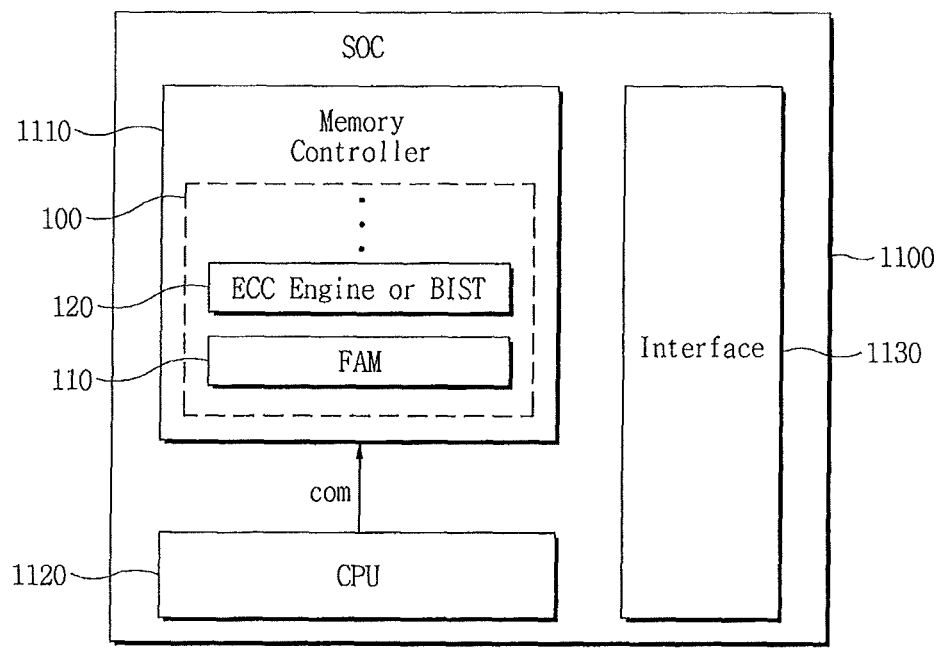
FIG. 6A is a diagram illustrating an exemplary embodiment of a system-on-chip (SOC) including a test device therein, in accordance with aspects of the inventive concept.

FIG. 6A is a diagram illustrating an embodiment of a system-on-chip (SOC) 1100 having a test device 100 therein, in accordance with aspects of the inventive concept.

Referring to FIG. 6A, the SOC 1100 includes a CPU 1120, a memory controller 1110, and an interface 1130. The memory controller 1110 includes the test device 100, in this embodiment. The test device 100 includes an ECC engine (and/or BIST unit) 120, a fail address memory (FAM) 110, a control unit, and so on, which are elements of the test device 100 illustrated in FIG. 5. The memory controller 1110 is connected to the CPU 1120 to receive a test command Com from the CPU 1120. The test command Com may be corresponded to a test start command, a test exit command, a command that instructs to start of transmission of a fail address, and a command that instructs and end of the transmission of the fail address. A fail address, a control signal, and data are transmitted to the memory device 200 via the interface 1130.

Figure 6B:
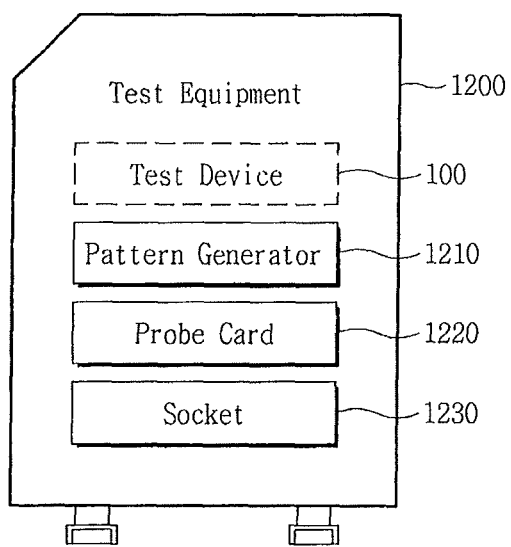
FIG. 6B is a diagram illustrating an exemplary embodiment of test equipment using a test device, in accordance with aspects of the inventive concept.

FIG. 6B is a diagram illustrating test equipment 1200 using a test device 100 in accordance with an embodiment of the inventive concept.

Referring to FIG. 6B, the test equipment 1200 includes the test device 100, a pattern generator 1210, a probe card 1220, and a socket 1230. The pattern generator 1200 generates various test data to test the memory device 200. The probe card 1220 directly contacts a test pad of the memory device 200 via a probe needle so as to transmit the test data. The socket 1230 removably fixes the memory device 200 during a test of the memory device 200.

Figure 7:
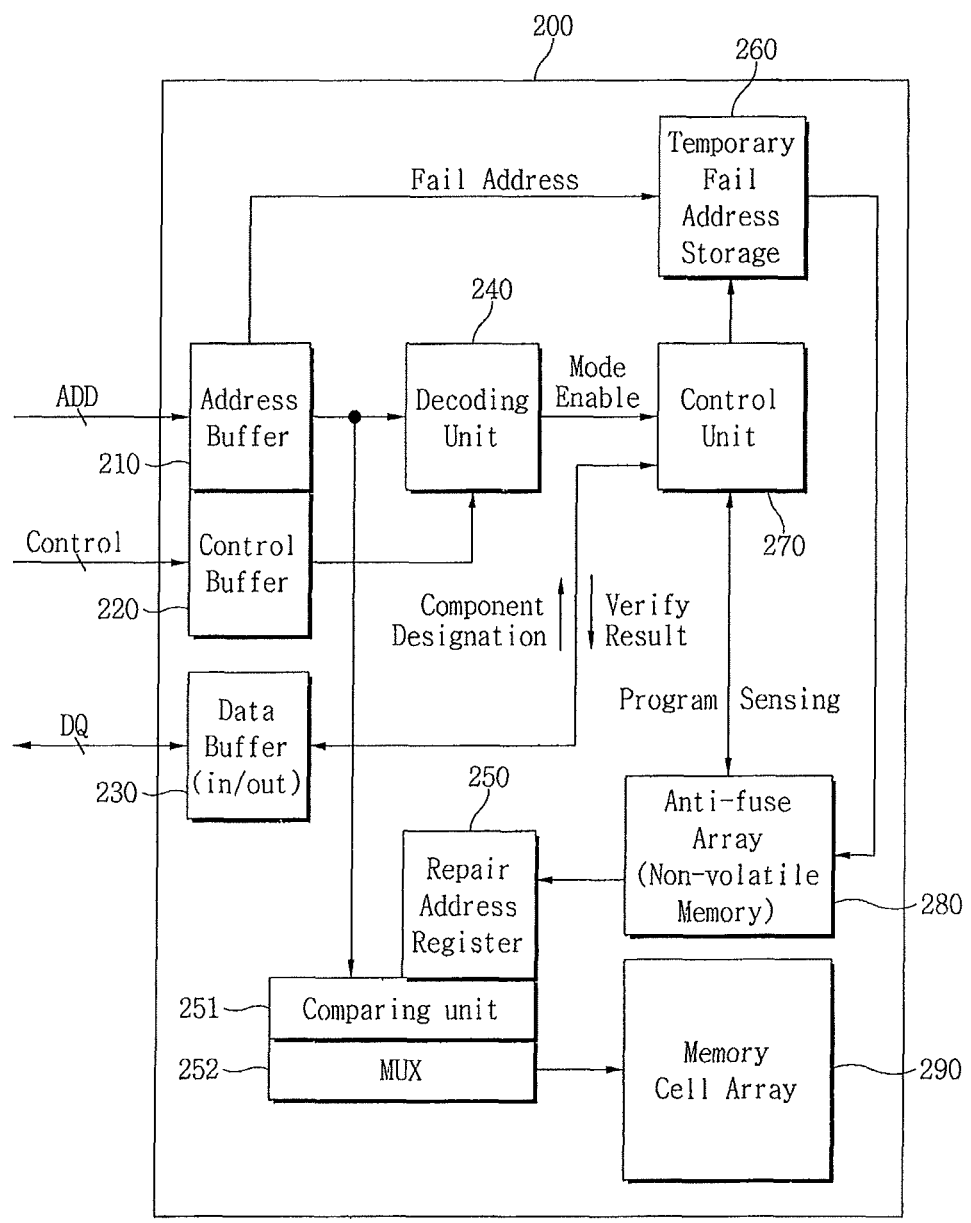
FIG. 7 illustrates a circuit block of an exemplary embodiment of a memory device, in accordance with aspects of the inventive concept.

FIG. 7 illustrates a circuit block diagram of an embodiment of a memory device 200, in accordance with aspects of the inventive concept.

Referring to the embodiment of FIG. 7, the memory device 200 includes an address buffer 210, a control buffer 220, a data buffer 230, a decoding unit 240, a repair address register 250, a comparing unit 251, a multiplexer (Mux) 252, a temporary fail address storage (TFAS) 260, a control unit 270, an anti-fuse array 280 which is a non-volatile storage device, and a memory cell array 290.

A fail address is received via the address buffer 210 and is temporarily stored in the temporary fail address storage 260. The temporary fail address storage 260 may be embodied as a register array, an SRAM, or a non-volatile memory, as examples. The decoding unit 240 receives a control signal via the control buffer 220, performs decoding, and generates a mode enable signal. The control signal includes a read command, a write command, a pre-charge command, a mode register set signal, and the like. The control unit 270 is activated according to the mode enable signal, and stores the fail address in the anti-fuse array 280, w5hich is a non-volatile memory storage device. The control unit 270 senses the stored fail address to verify whether the fail address is accurately programmed. A result of the programming (verification result) is transmitted to the test device 100 via a data output pin. The anti-fuse array 280, which is a non-volatile storage device, is connected to the repair address register 250 configured to store the fail address. The repair address register 250 is connected to the comparing unit 251, which is configured to compare the fail address with an external address. The comparing unit 251 is connected to the multiplexer (Mux) 252, which is configured to select one of the fail address and the external address. Data received via the I/O data buffer 230 may be used as a chip selection signal (component designation) for selecting a chip on a memory module.

Figure 8:
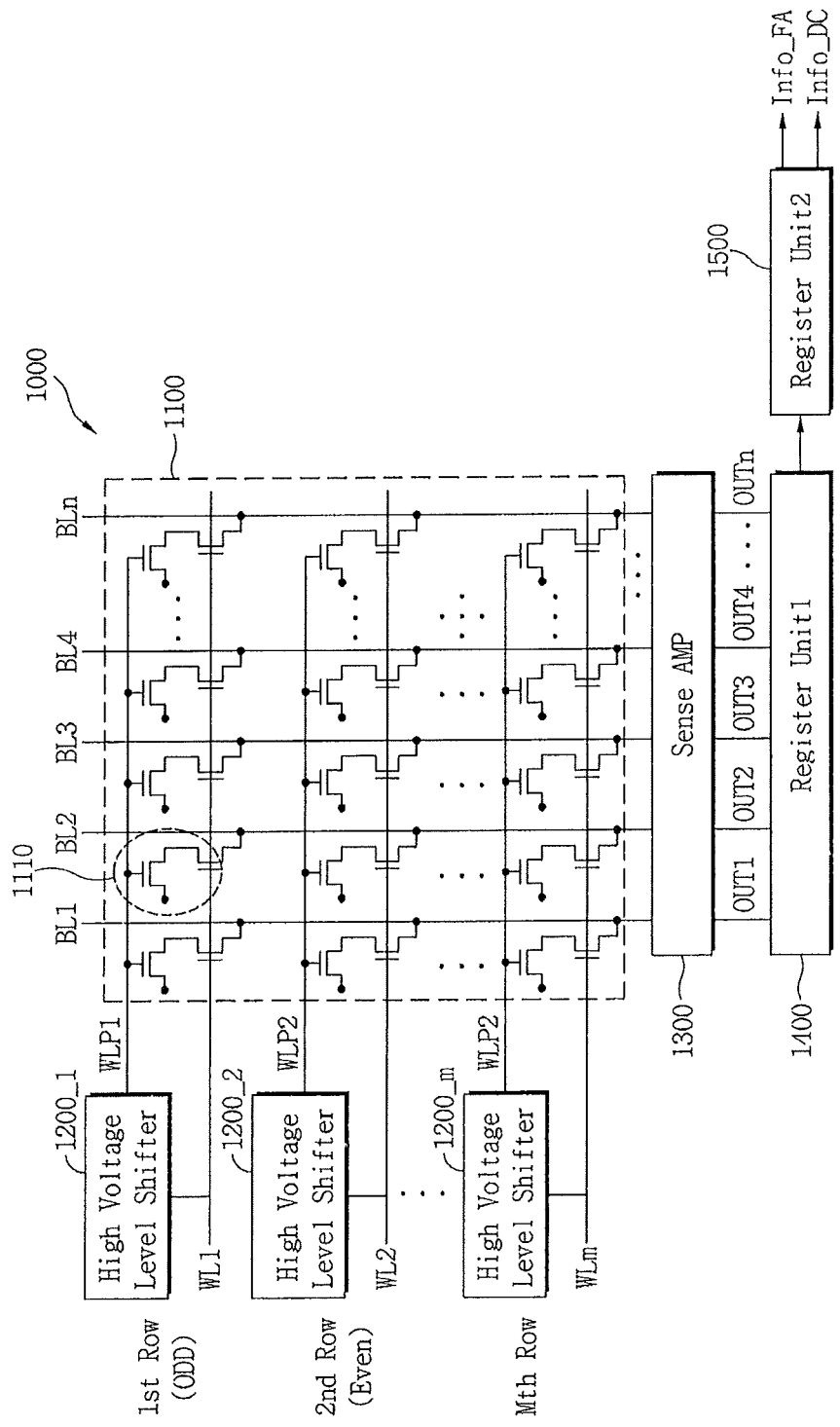
FIG. 8 is a diagram illustrating an exemplary embodiment of a non-volatile storage device, in accordance with aspects of the inventive concept.

FIG. 8 is a diagram illustrating an embodiment of a non-volatile storage device 1000, in accordance with aspects of the inventive concept.

Referring to the embodiment of FIG. 8, the non-volatile storage device 1000 includes a fuse array 1100 on which a plurality of fuses 1110 is disposed, level shifters 1200_1 to 1200_m that generate a high voltage to change resistance states of the plurality of fuses 1110, and a sense amplifier 1300 that senses/amplifies information stored in the fuse array 1100. The non-volatile storage device 1000 further includes a first register unit 1400 and a second register unit 1500 to store fuse data generated when information stored in the anti-fuse array 1100 is read. Each of the first register unit 1400 and the second register unit 1500 may be embodied in a shift register having a plurality of registers.

The fuse array 1100 includes the plurality of fuses 1110 in which information is stored. The fuse array 1100 may include laser fuses, the connections of which are controlled through laser irradiation, or may include electric fuses, the connections of which are controlled according to an electrical signal. Otherwise, the fuse array 1100 may include anti-fuses, the states of which are changed from a high resistance state to a low resistance state, according to an electrical signal, e.g., a high-voltage signal. The fuse array 1100 may include any type of fuses among the various types of fuses described above. In the following embodiment, it is assumed that the fuse array 1100 is an anti-fuse array including anti-fuses. Also, information stored in the anti-fuses or data read from the anti-fuses will be hereinafter referred to as fuse data.

In the presently preferred embodiment, the anti-fuse array 1100 has an array structure in which fuses from the plurality of fuses 1110 are disposed at intersections of a plurality of rows and a plurality of columns. For example, if the anti-fuse array 1100 includes m rows and n columns, then the anti-fuse array 1100 includes m×n anti-fuses 1110. The anti-fuse array 1110 includes m word lines WL1 to WLm for accessing the anti-fuses 1110 disposed in the m rows, and n bit lines BL1 to BLn disposed to correspond to the n columns to deliver information read from the plurality of anti-fuses 1110.

The anti-fuse array 1100 stores various information related to an operation of the non-volatile storage device 1000. For example, the anti-fuse array 1100 may store a plurality of pieces of setting information for setting an operating environment of the non-volatile storage device 1000. The plurality of pieces of setting information are programmed by changing the states of the plurality of anti-fuses 1110 by supplying voltage signals WLP1 to WLPm provided from the level shifters 1200_1 to 1200_m to the anti-fuse array 1100. Information is stored in the plurality of anti-fuses 1110 by programming the plurality of anti-fuses 1110 from the high resistance state to the low resistance state, unlike a general fuse circuit, e.g., a laser fuse circuit or an electric fuse circuit. The plurality of anti-fuses 1110 may have a structure in which a dielectric layer is disposed between two conductive layers, i.e., a capacitor structure. The plurality of anti-fuses 1110 is programmed by breaking down the dielectric layer, which is accomplished by applying high voltage between the two conductive layers.

After the anti-fuse array 1100 is programmed, a read operation is performed on the anti-fuse array 1100, together with start of driving of the non-volatile storage device 1000.

The read operation may be performed on the anti-fuse array 1100 simultaneously with the driving of the anti-fuse array 1100 or a predetermined set time after the driving of the non-volatile storage device 1000. In the anti-fuse array 1100, a word line selection signal is provided via the word lines WL1 to WLm, and information stored in a selected anti-fuse 1110 is provided to the sense amplifier 1300 via the bit lines BL1 to BLn. According to characteristics of the array structure, the information stored in the anti-fuse array 1100 may be randomly accessed by driving the word lines WL1 to WLm and the bit lines BL1 to BLn.

For example, as the word lines WL1 to WLm are sequentially driven, the plurality of anti-fuses 1110 are sequentially accessed from a first row to an $m^{th}$ row in the anti-fuse array 1100. The information that is sequentially accessed from the plurality of anti-fuses 1110 is provided to the sense amplifier 1300. The sense amplifier 1300 includes one or more sense amplifier circuits. For example, when the anti-fuse array 1100 includes n columns, the sense amplifier 1300 includes n sense amplifier circuits corresponding to the n columns. The n sense amplifier circuits are connected to the n bit lines BL1 to BLn, respectively. FIG. 1 illustrates a case in which two sense amplifier circuits are disposed to correspond to each of the n bit lines BL1 to BLn. For example, an odd-numbered sense amplifier circuit and an even-numbered sense amplifier circuit are disposed to correspond to a first bit line BL1. The odd-numbered sense amplifier circuit senses/amplifies and outputs information stored in the anti-fuses 1110 connected to odd-numbered word lines WL1, WL3, WL5, . . . . The even-numbered sense amplifier circuit senses/amplifies and outputs information stored in the anti-fuses 1110 connected to even-numbered word lines WL2, WL4, WL6, . . . . However, the inventive concept is not limited thereto, and sense amplifier circuits may be arranged in any of various shapes. As examples, only one sense amplifier circuit may be arranged to correspond to one bit line, or three or more sense amplifier circuits may be arranged to correspond to one bit line.

The sense amplifier 1300 senses/amplifies and outputs the information accessed from the anti-fuse array 1100. The sensed/amplified information is fuse data OUT1 to OUTn that is actually used to set an operating environment of the non-volatile storage device 1000. As described above, since FIG. 1 illustrates a case in which two sense amplifier circuits are provided to correspond to each bit line, actually, a piece of fuse data, e.g., first fuse data OUT1, may include an odd-numbered piece of fuse data and an even-numbered piece of fuse data.

The fuse data OUT1 to OUTn output from the sense amplifier 1300 is provided to the first register unit 1400. The first register unit 1400 may be embodied as a shift register in which a plurality of registers is connected in series to sequentially deliver a signal. Also, the number of registers included in the first register unit 1400 is less than that of the plurality of anti-fuses 1110 included in the anti-fuse array 1100. Also, the number of registers included in the first register unit 1400 may be determined based on that of columns included in the anti-fuse array 1100. For example, when the anti-fuse array 1100 includes n columns, the first register unit 1400 may include n registers. Otherwise, as described above, when two sense amplifier circuits are arranged to correspond to each bit line, the first register unit 1400 may include 2×n registers.

The first register unit 1400 receives the fuse data OUT1 to OUTn in units of the rows in the anti-fuse array 1100. For, example, when one row is selected from among the rows of the anti-fuse array 1100, fuse data OUT1 to OUTn stored in anti-fuses 1110 connected to a word line of the selected row is provided in parallel to the first register unit 1400. The first register unit 1400 provides the fuse data OUT1 to OUTn to the second register unit 150 by shifting the provided fuse data OUT1 to OUTn in units of bits. The second register unit 1500 may be embodied as a shift register in which a plurality of registers is connected in series to sequentially deliver a signal. The number of registers included in the second register unit 1500 may be equal to that of the plurality of anti-fuses 1110 included in the anti-fuse array 1100. Fuse data OUT1 to OUTn stored in the second register unit 1500 may be used as information for setting an operating environment of the non-volatile storage device 1000. For example, some of the fuse data OUT1 to OUTn stored in the second register unit 1500 may be used as information Info_FA for replacing a memory cell (not shown) included in the non-volatile storage device 1000 with a redundant memory cell, and some of the fuse data OUT1 to OUTn may be used as trimming information Info_DC for adjusting a voltage generated in the non-volatile storage device 1000.

To store the fuse data OUT1 to OUTn from the anti-fuse array 1100, the followings are used, in the preferred embodiment: (i) registers connected to the sense amplifier 1300 are used to temporarily store the fuse data OUT1 to OUTn; and (ii) registers coupled to various circuit blocks of the non-volatile storage device 1000, e.g., a row and column decoder or a direct-current (DC) voltage generator, are used to provide fuse data OUT1 to OUTn to the circuit blocks.

In accordance with an exemplary embodiment of the inventive concept, the first register unit 1400 receives the fuse data OUT1 to OUTn from the sense amplifier 1300, and transmits the fuse data OUT1 to OUTn to the second register unit 1500 coupled to these circuit blocks. In particular, in this embodiment, the anti-fuse array 1100 has the array structure, and the first register unit 1400 includes the registers, the number of which corresponds to that of columns included in the anti-fuse array 1100. Thus, the number of registers included in the first register unit 1400 is less than that of the plurality of anti-fuses 1110 included in the anti-fuse array 1100. For example, when one sense amplifier circuit is arranged to correspond to each bit line, the first register unit 1400 includes n sense amplifier circuits. Thus, the number of registers in the first register unit 1400 related to the fuse data OUT1 to OUTn need not be m×n and may thus be n. In particular, even if a large number of anti-fuses 1110 are included in the anti-fuse array 1100, the number of registers included in the first register unit 1400 may be limited to n, according to the structure of the anti-fuse array 1100. Accordingly, the number of registers included in the first register unit 1400 may be prevented from being proportionally increased.

Figure 9:
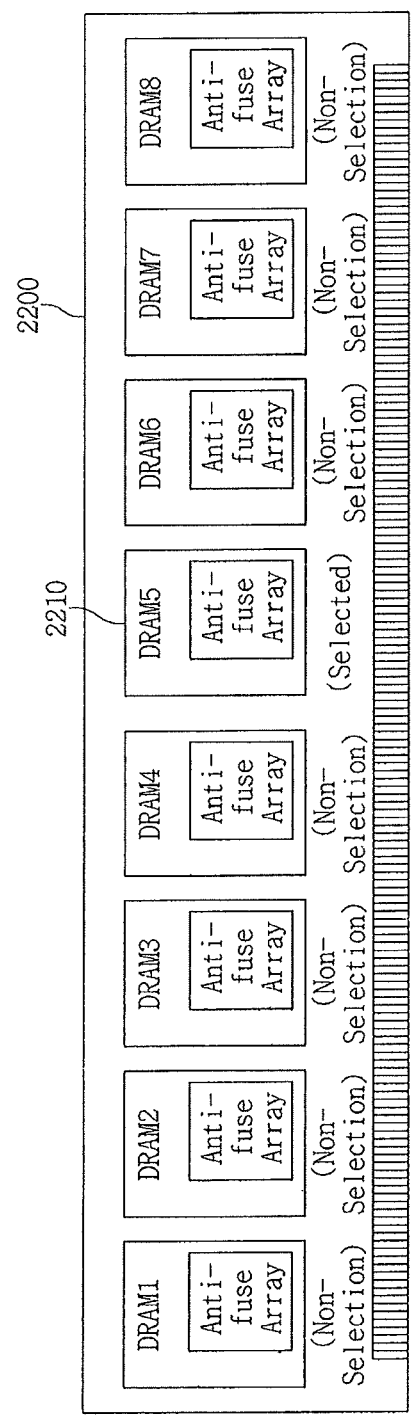
FIG. 9 illustrates an exemplary embodiment of a structure of a memory module, in accordance with aspects of the inventive concept.

FIG. 9 illustrates an embodiment of a structure of a memory module 2200, in accordance with aspects of the inventive concept.

Referring to the embodiment of FIG. 9, the module 2200 includes one or more memory devices in accordance with aspects of the inventive concept. For example, the module 2200 includes eight DRAMs. Each of the DRAMs includes an anti-fuse array, which is a non-volatile storage device. When a fail address is stored in a DRAM5, for example, a memory controller may select the DRAM5 by transmitting data '0' to only the DRAM5. The anti-fuse array included in each of the DRAMs is used to store a generated fail address in the DRAM. A command and an address are shared by the eight DRAMs.

Figure 10:
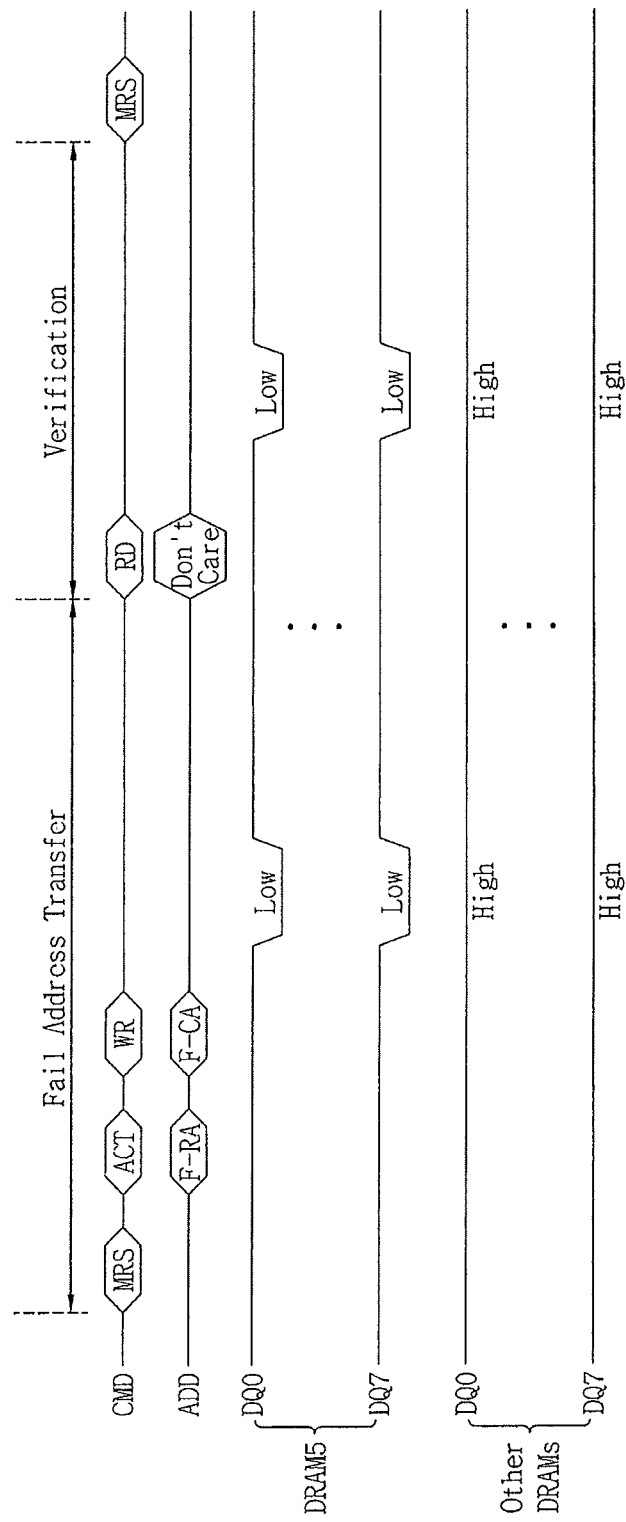
FIGS. 10 and 11 are timing diagrams illustrating an exemplary embodiment of timing when a fail address is transmitted, in accordance with aspects of the inventive concept.
Figure 11:
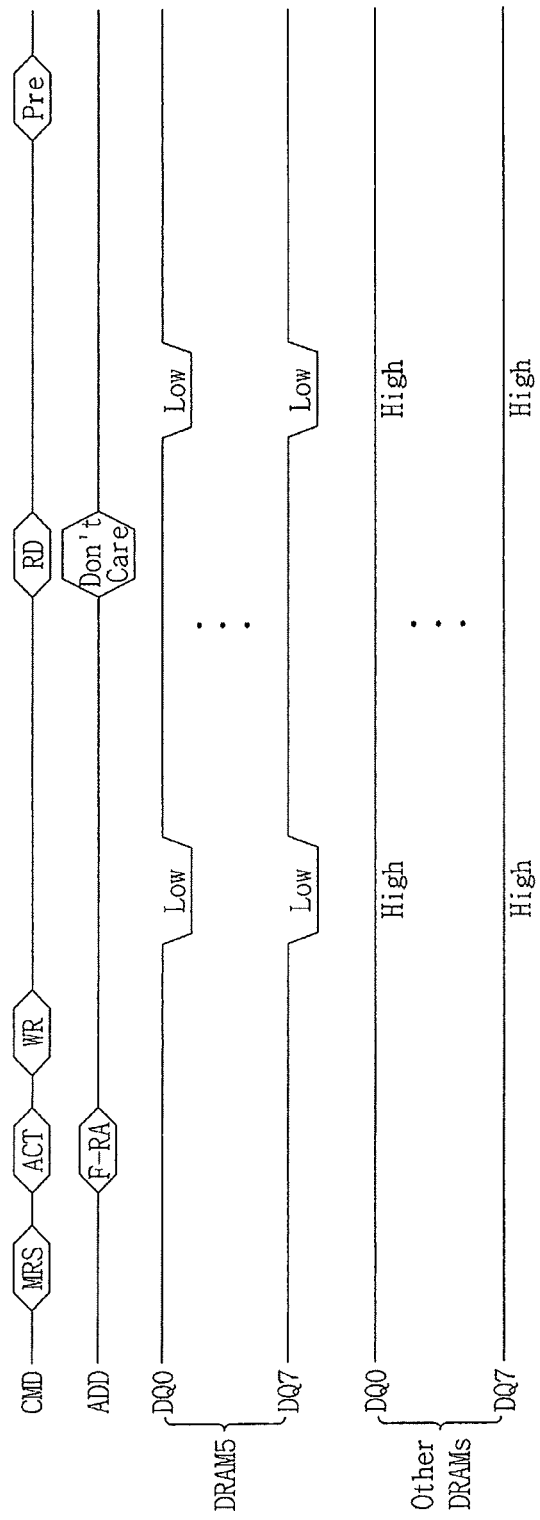

FIGS. 10 and 11 are embodiments of timing diagrams illustrating timing when a fail address is transmitted, in accordance with aspects of the inventive concept.

Referring to FIG. 10, a mode set register command MRS, an active command ACT, a read command RD, and a write command WR are received via a command line CMD. A row fail address F-RA and a column fail address F-CA are received via an address line ADD. In the module 2200 of FIG. 9, the DRAM5 may be selected among the eight DRAMs by receiving only data '0' (logic low) via a data pin DQ. Since data received via data pins DQ0 to DQ7 all becomes logic 'low,' a fail address is thus stored in the anti-fuse array, which is a non-volatile storage device included in the DRAM5. After the mode register set command MRS, the active command ACT, and the write command WR are sequentially input and the row fail address F-RA and the column fail address F-CA are input, data '0' is supplied as final chip selection data via the data pin DQ and the fail address is stored in the anti-fuse array. This section is a fail address transfer section. A section between when the programmed fail address is read according to the read command RD and when another mode register set command MRS is received is a verification section. A verification process is completed when the other mode register set command MRS is input after the read command is received.

The timing diagram of FIG. 11 is similar to the timing diagram of FIG. 10, except that a memory cell corresponding to a fail address is repaired by receiving only a row fail address F-RA via an address line ADD. Also, when a verification process is performed to read the fail address again, the verification process is completed according to a pre-charge command and a current mode is exited.

Figure 12:
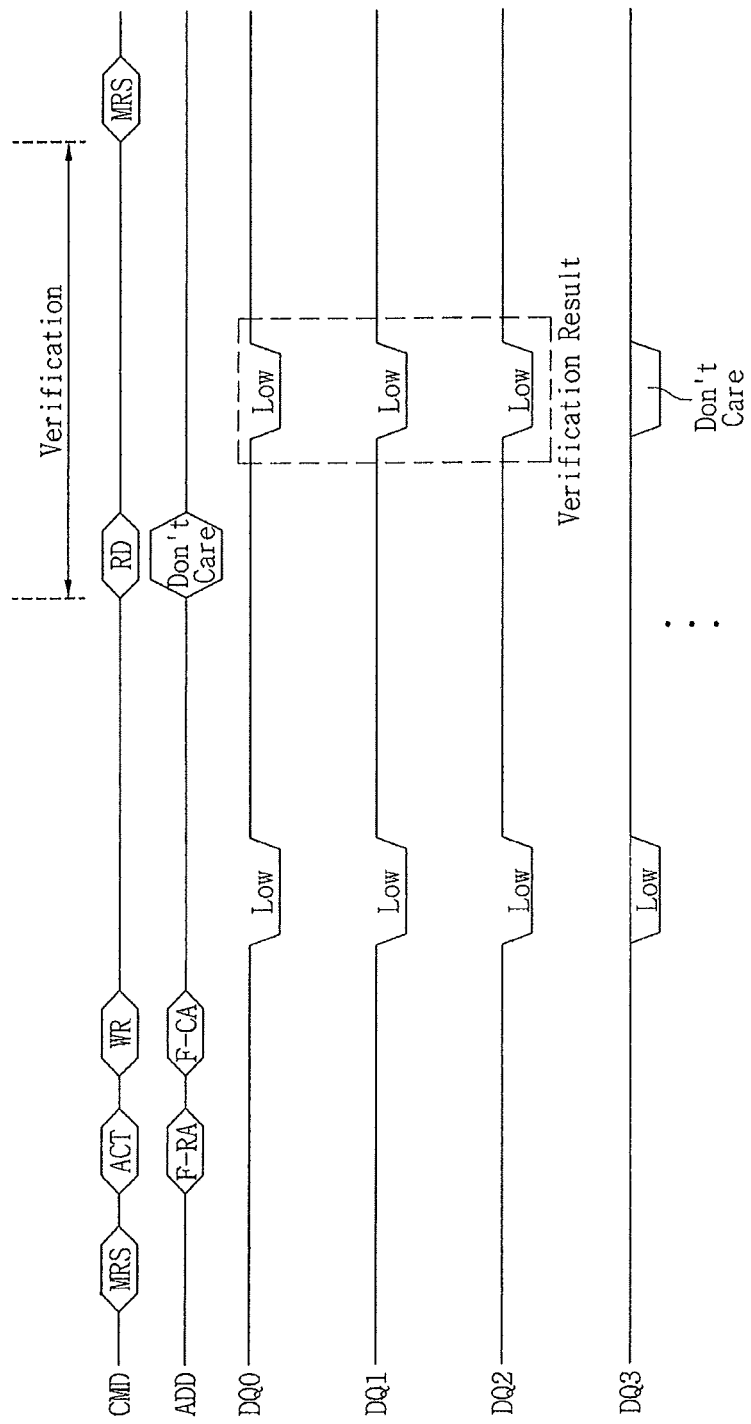
FIG. 12 is a timing diagram illustrating an exemplary embodiment of timing when a verification result is transmitted in parallel, in accordance with aspects of the inventive concept.

FIG. 12 is an embodiment of a timing diagram illustrating timing when verification results are transmitted in parallel, in accordance with aspects of the inventive concept.

Referring to the embodiment of FIG. 12, when a mode register set command MRS, an active command ACT, and a write command WR are input via a command line CMD, a row fail address F-RA and a column fail address F-CA are stored in an anti-fuse array which is a non-volatile memory device. Then, states of the stored row fail address F-RA and a column fail address F-CA are checked by reading the row fail address F-RA and a column fail address F-CA to verify them, and resultant verification result is transmitted to the test device 100 via data pins DQ0, DQ1, and DQ2. For example, the verification result that is three logic lows (V) is transmitted in parallel via the data pins DQ0, DQ1, and DQ2. Values transmitted to the other data pins DQ3, ..., DQ7, is not recognized by a memory controller.

FIG. 13 is a table illustrating an embodiment of verification results to be transmitted in parallel, according to aspects of the inventive concept.

Referring to the embodiment of FIG. 13, states of the verification result may be checked by reading the verification result stored in an anti-fuse array, which is a non-volatile memory. If verification result transmitted via data pins DQ0, DQ1, and DQ2 is all logic low (Case 1), this means that programming is completed normally and a fail bit is replaced with row redundant cells. If the verification result transmitted via the data pins DQ0, DQ1, and DQ2 is logic low, low, and high, respectively (Case 2), this means that programming is completed normally and a fail bit is replaced with column redundant cells. If the verification result transmitted via the data pins DQ0, DQ1, and DQ2 is logic low, high, and low, respectively (Case 3), this means that programming is completed normally and a fail bit is replaced with a single redundant cell. If the verification result transmitted via the data pins DQ0, DQ1, and DQ2 is logic low, high, and high, respectively (Case 4), this means that no specific meaning is given for future use.

Cases 5 to 8 each denote that programming is performed incompletely. If the verification result transmitted via the data pins DQ0, DQ1, and DQ2 is logic high, low, and low, respectively (Case 5), this means that a rupture process performed on a memory cell has a problem, i.e., did not complete properly. If the verification result transmitted via the data pins DQ0, DQ1, and DQ2 is logic high, low, and high, respectively (Case 6), this means that the rupture process is still in progress. In this case, verification may be temporarily delayed and then requested according to a read command RD. If the verification result transmitted via the data pins DQ0, DQ1, and DQ2 is logic high, high, and low, respectively (Case 7), this means that there is no available redundant cell. Thus, a fail bit cannot be repaired and should thus be replaced with another memory cell. If the verification result transmitted via the data pins DQ0, DQ1, and DQ2 is all logic high (Case 8), this means that a current chip is not selected. The verification result is transmitted in parallel to the test device 100 via the data pins DQ0, DQ1, and DQ2.

Figure 14:
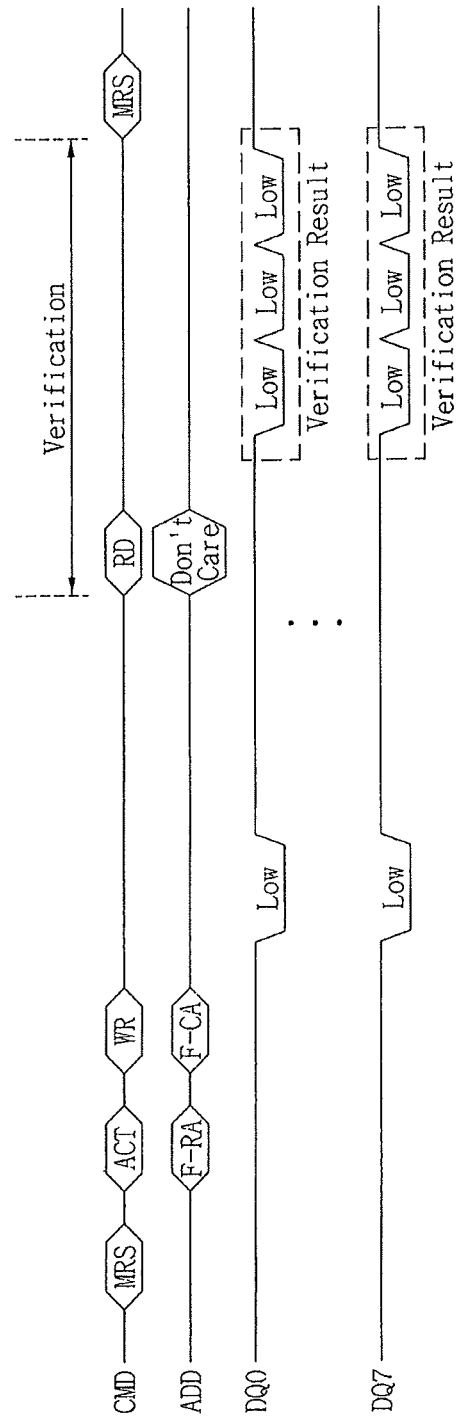
FIG. 14 is a timing diagram illustrating an exemplary embodiment of timing when verification results are transmitted, in accordance with aspects of the inventive concept.

FIG. 14 is an embodiment of a timing diagram illustrating timing when verification results are transmitted, in accordance with aspects of the inventive concept.

Referring to the embodiment of FIG. 14, the verification results illustrated in FIG. 13 are transmitted in series. For example, a 3-bit verification result is transmitted in series via a data pin DQ0. The same 3-bit verification result may be transmitted to the test device 100 via a data pin DQ7.

FIG. 15 is a table illustrating an embodiment of verification results to be transmitted in series, in accordance with aspects of the inventive concept.

Referring to FIG. 15, Case 1 (LLL) denotes that a fail bit is replaced with row redundant cells. For example, a 3-bit verification result is transmitted in series to the test device 100 via one data pin DQ. Case 6 (HLH) denotes that a rupture process is still in progress, in which a 3-bit verification result is transmitted in series to the test device 100 via data pins DQ0, DQ1, DQ2, and DQ3.

Figure 16:
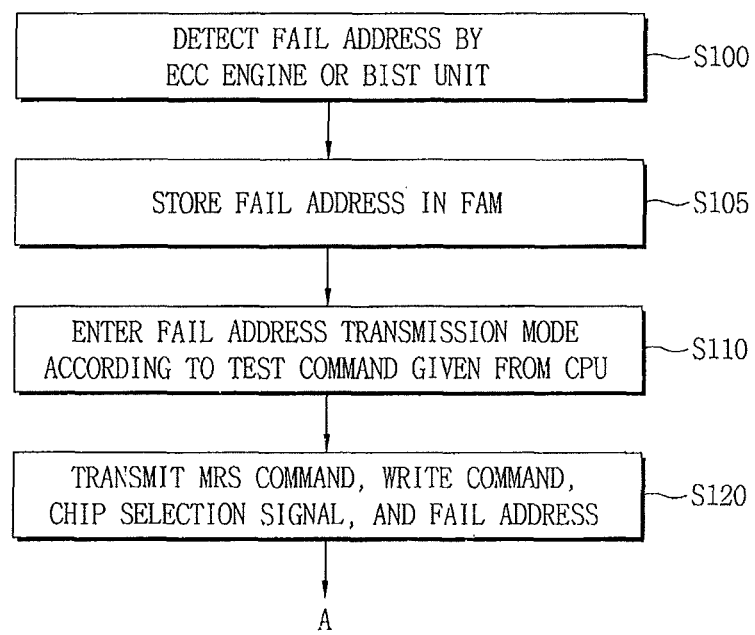
FIGS. 16 and 17 are timing charts illustrating an exemplary embodiment of a method of operating a test device, in accordance with aspects of the inventive concept.
Figure 17:
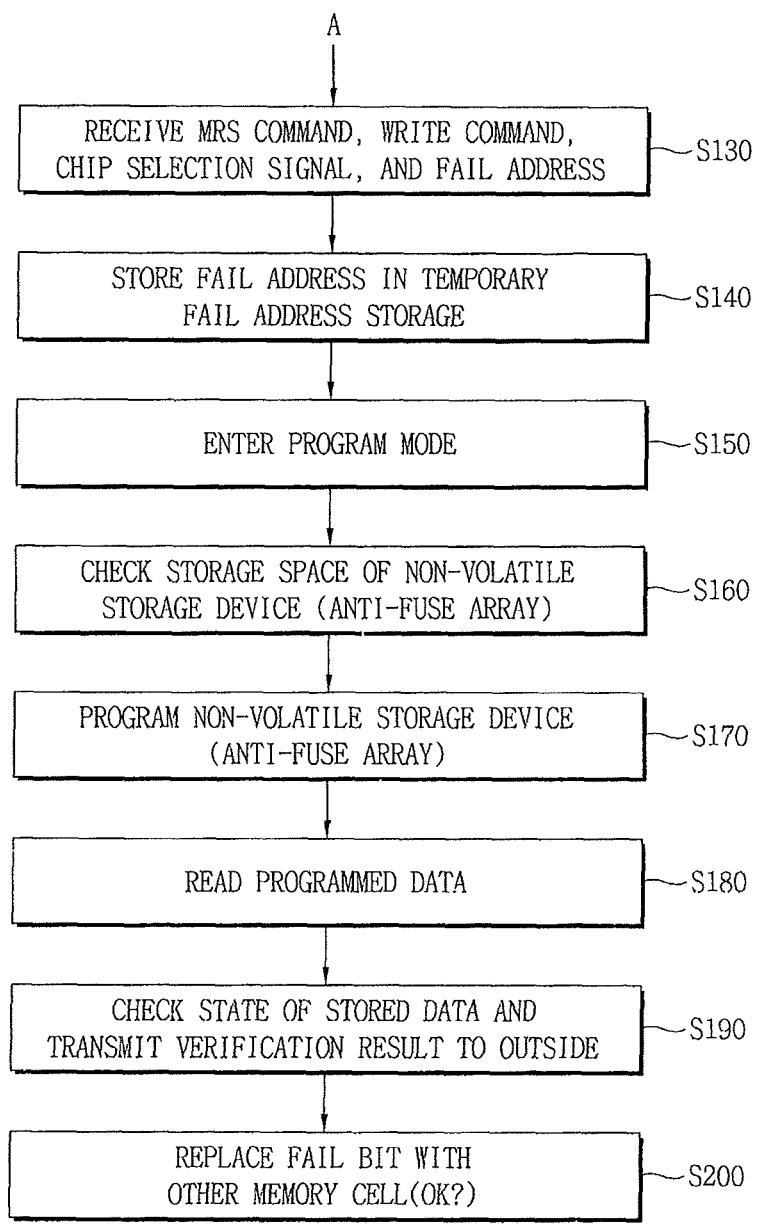

FIGS. 16 and 17 are timing charts illustrating an embodiment of a method of operating a test device, according to aspects of the inventive concept.

Referring to the embodiment of FIG. 16, a test device performs fail address detection and transmission as described below. First, a fail address is detected using an ECC engine or a BIST unit (operation S100). Then, the detected fail address is stored in a fail address memory (FAM) (operation S105). Then, a fail address transmission mode is entered according to a test command given from a CPU (operation S110). The test commands include a test start command, a test exit command, a command that instructs to start transmission of the fail address, and a command that instructs to end the transmission of the fail address. Then, a mode register set command, a chip selection signal, and the fail address are transmitted (operation S120).

Referring to the embodiment of FIG. 17, a memory device receives the mode register set command, a write command, the chip selection signal, and the fail address (operation S130). Then, the fail address is stored in a temporary fail address storage (operation S140). Then, a mode of programming a non-volatile storage device is entered (operation S150). Then, a storage space of an anti-fuse array, which is a non-volatile storage device, is checked (operation S160). Then, the anti-fuse array, which is a non-volatile storage device, is programmed (operation S170). Then, programmed data is read to verify the stored fail address (operation S180). Then, a state of the stored data is checked and a verification result is then transmitted to the outside (operation S190), i.e., external to the memory device. Finally, a fail bit is replaced with another memory cell (operation S200).

Figure 18:
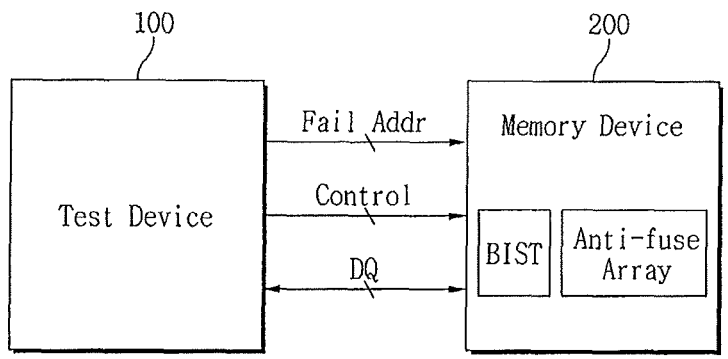
FIG. 18 is a conceptual diagram of exemplary embodiment of a memory test system, in accordance with another aspect of the inventive concept.

FIG. 18 is a conceptual diagram of another embodiment of a memory test system, in accordance with aspects of the inventive concept.

Referring to the embodiment of FIG. 18, the memory test system includes a test device 100 and a memory device 200, such as the embodiments described above. In this embodiment, the test device 100 transmits a fail address Addr, a control signal, and data DQ. The memory device 200 includes a BIST unit and an anti-fuse array, which is a non-volatile memory device. The BIST unit tests the memory device 200 according to a test command received from the test device 100, and stores the fail address in the anti-fuse array.

Figure 19:
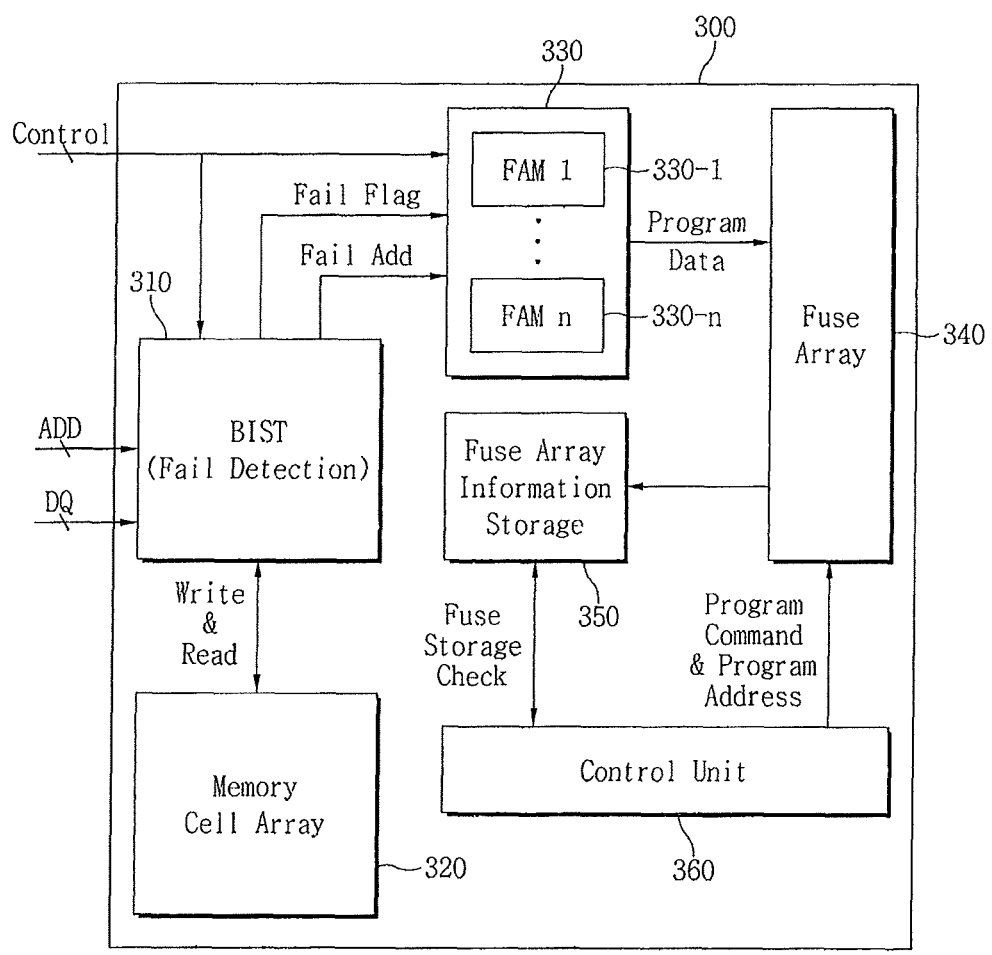
FIG. 19 illustrates a circuit block diagram of an exemplary embodiment of a memory device, in accordance with another aspect of the inventive concept.

FIG. 19 illustrates a circuit block of another embodiment of a memory device 300, in accordance with aspects of the inventive concept.

Referring to FIG. 19, the memory device 300 includes a fuse array 340, as a non-volatile memory constructed to store a fail address as program data, a temporary fail address memory (FAM) 330, a fuse array information storage 350 configured to store information about a fuse, a control unit 360 configured to control the fuse array 340 and the fuse array information storage 350, a BIST unit 310 configured to detect a fail address, and a memory cell array 320. The BIST unit 310 receives a test command Control and test data DQ from a test device 100, and detects a fail address by writing the test data DQ to the memory cell array 320 and then reading the test data DQ from the memory cell array 320. When a fail bit occurs, a fail flag and a fail address corresponding to the fail bit are transmitted to the FAM 330.

The FAM 330 may be embodied as a register including a plurality of fail address arrays FAM1, ..., FAMn, in various embodiments. The control unit 360 may check a space of the fuse array 340 using the fuse array information storage 350, to determine if there are available fuses in the fuse array. The control unit 360 may also control a program command and a program address to be stored in the fuse array 340. The test command can be supplied to the test device according to the control signal, and the BIST unit 310 is thus activated. Also, the fail address stored in the FAM 330 is transmitted to the fuse array 340 according to the control signal.

Figure 20:
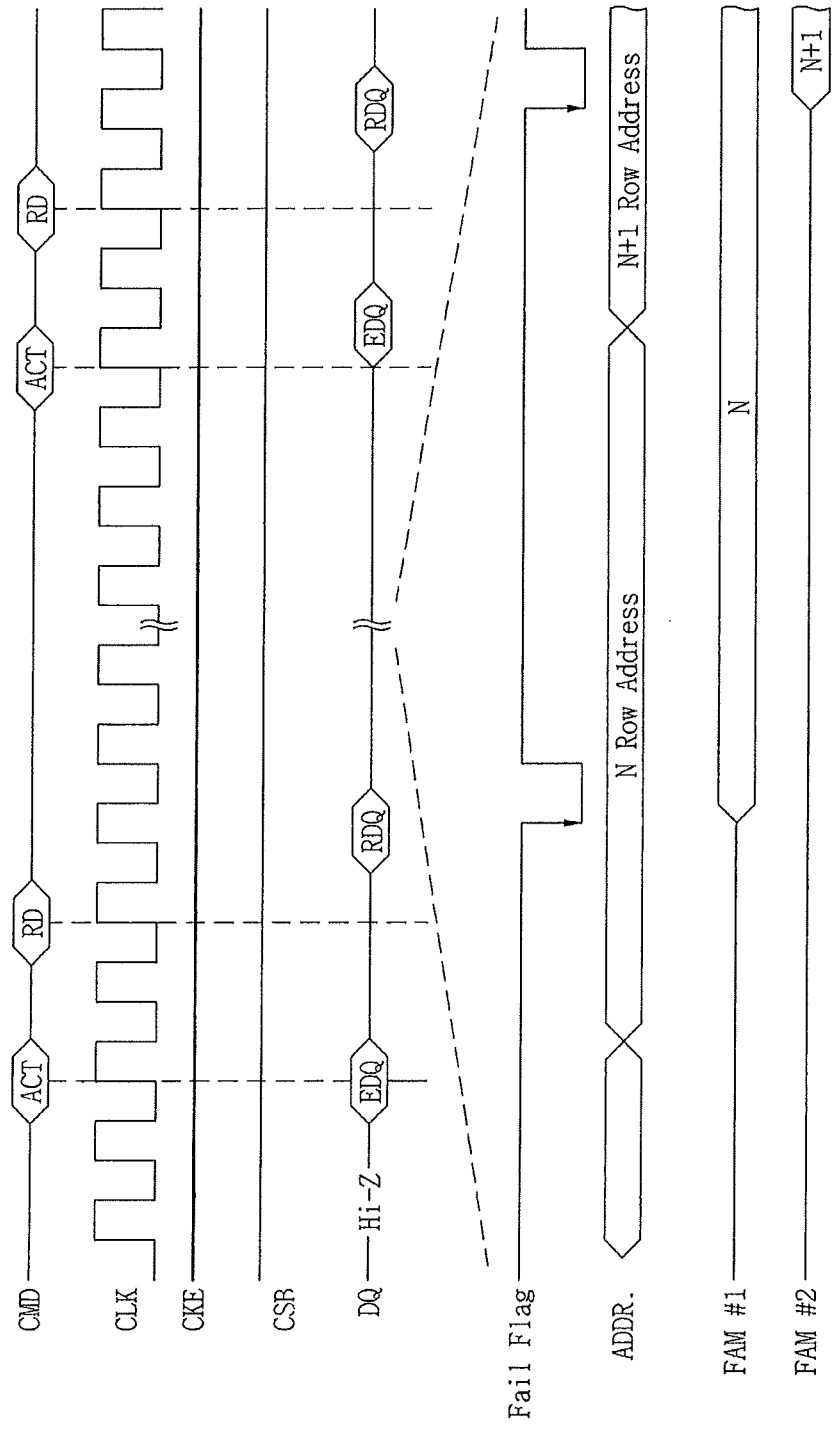
FIGS. 20 and 21 are timing diagrams illustrating an exemplary embodiment of an operation of a memory device, in accordance with aspects of the inventive concept.
Figure 21:
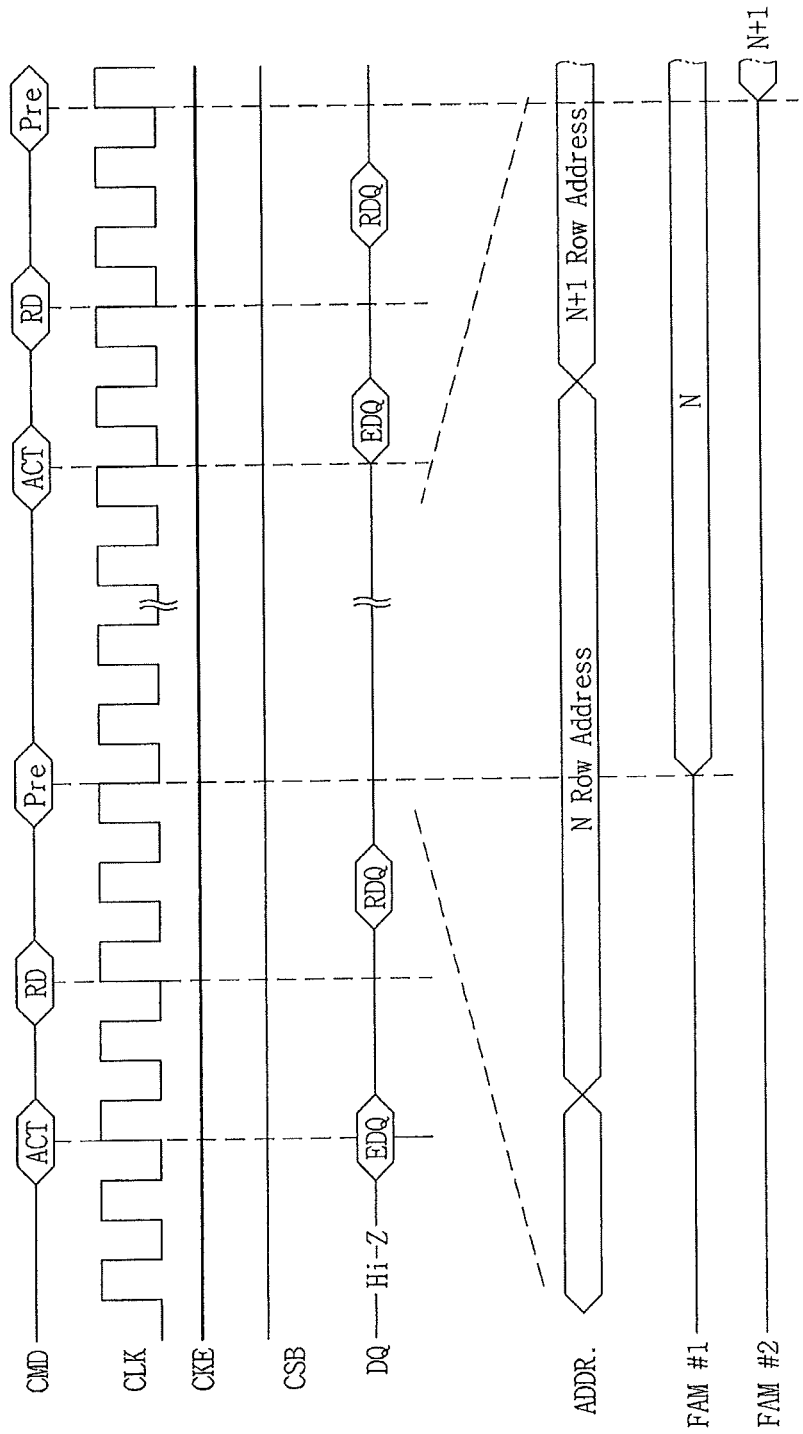

FIGS. 20 and 21 are embodiment of timing diagrams illustrating an operation of a memory device, in accordance with aspects of the inventive concept.

Referring to the embodiment of FIG. 20, an active command ACT and a read command RD are input via a command line CMD. Test data EDQ is input via a data pin DQ. The test data EDQ is written to a memory cell array, and read data RDQ is generated by reading the test data EDQ stored in the memory cell array according to the read command RD. When a fail flag signal changes from logic high to logic low, an $N^{th}$ row address is written to a fail address memory FAM #1. When the fail flag occurs again, an $(N+1)^{th}$ row address is written to a fail address memory FAM #2. Such a command and data are input in synchronization with a clock signal CLK, and a clock enable signal CKE and a chip selection signal are also input in synchronization with the clock signal CLK.

Referring to the embodiment of FIG. 21, an active command ACT, a read command RD, and a pre-charge command Pre are input via a command line CMD. The timing diagram of FIG. 21 is substantially similar to that of FIG. 20, except that an $N^{th}$ row address is transmitted to a fail address memory FAM #1 when the pre-charge command Pre is input, and an $(N+1)^{th}$ row address is transmitted to a fail address memory FAM #2 when the pre-charge command Pre is input again. The FAM 330 of FIG. 19 may be embodied as a register, an SRAM, or the like, as examples.

Figure 22:
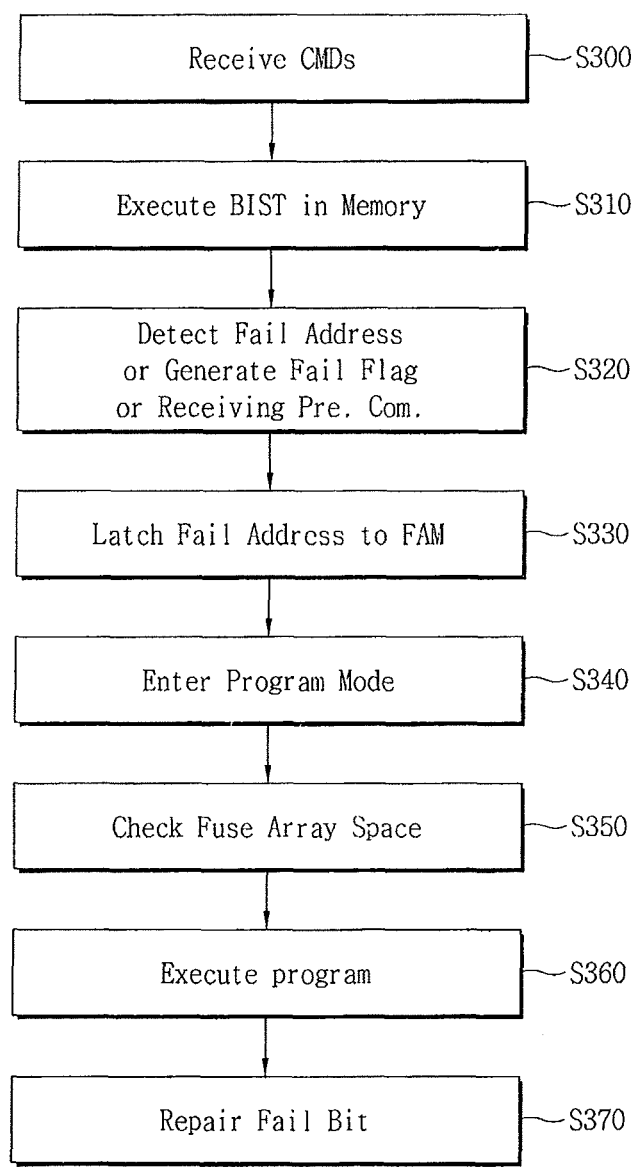
FIG. 22 is a flowchart illustrating an exemplary embodiment of a method of operating a memory device, according to aspects of the inventive concept.

FIG. 22 is a flowchart illustrating an embodiment of a method of operating a memory device, according to aspects of the inventive concept.

Referring to the embodiment of FIG. 22, the memory device receives an active command, a write command, and a read command from a test device (operation S300). Then, a BIST unit of the memory device is activated according to a command (operation S310). Then, a fail address is detected, a fail flag is generated, or a pre-charge command is received (operation S320). Then, the fail address is stored in a fail address memory according to the fail flag or the pre-charge command (operation S330). Then, a fuse array enters a program mode for programming the fail address (operation S340). Then, the capacity of a fuse memory is checked to determine the availability of fuses (operation S350). Then, the fuse array is programmed (operation S360). Thereafter, a fail bit is repaired (operation 5370) by using the fuse array to program a redundant cell, in place of the memory cell having the fail bit.

Figure 23:
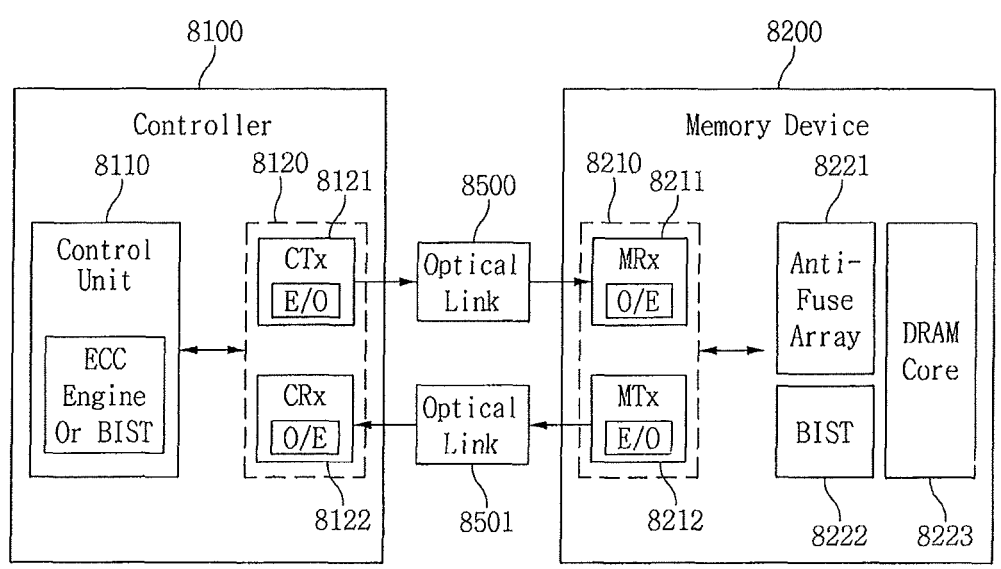
FIG. 23 is a diagram illustrating an exemplary embodiment of optical links of a memory test system, in accordance with aspects of the inventive concept.

FIG. 23 is a diagram illustrating an embodiment of a memory system having optical links, in accordance with aspects of the inventive concept.

Referring to the embodiment of FIG. 23, the memory test system includes a controller 8100 and a memory device 8200. The controller 8100 includes a control unit 8110, a controller transmitter 8121, and a controller receiver 8122. The control unit 8110 includes at least one of an ECC engine and a BIST unit. The controller transmitter 8121 includes an electrical-to-optical (E/O) interface circuit that converts an electrical signal into an optical signal. The controller receiver 8122 includes an optical-to-electrical (O/E) interface circuit that converts an optical signal into an electrical signal. The memory device 8200 includes an anti-fuse array 8221, which is a non-volatile storage device, a BIST unit 8222, a DRAM core 8223, a transmitter 8312, and a receiver 8211, in this embodiment. The transmitter 8312 includes an E/O interface unit that converts an electrical signal into an optical signal. The receiver 8211 includes an O/E interface unit that converts an optical signal into an electrical signal. The controller 8100 and the memory device 8200 are connected via a first optical link 8500 and a second optical link 8501 to transmit and receive data. In another exemplary embodiment of the inventive concept, data may be transmitted and received via one optical link, rather than plural optical links. An I/O circuit 8120 of the controller 8100 and an I/O circuit 8210 of the memory device 8200 are connected via the first optical link 8500 and the second optical link 8501.

Figure 24:
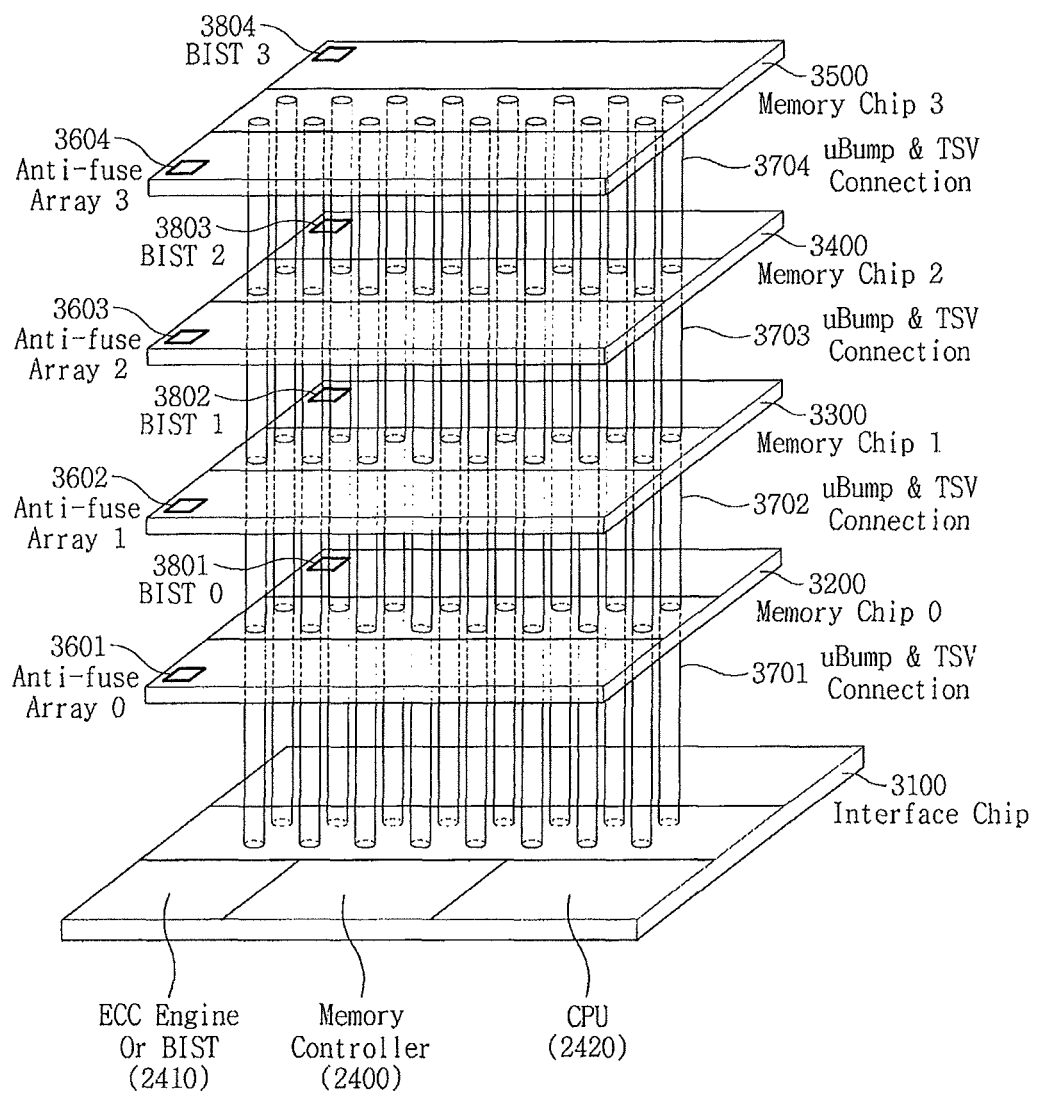
FIG. 24 illustrates an exemplary embodiment of through-silicon-via (TSV) stacked chips to which a memory test system is applied, in accordance with aspects of the inventive concept.

FIG. 24 illustrates an embodiment having through-silicon-via (TSV) stacked chips to which a memory test system is applied, in accordance with aspects of the inventive concept.

Referring to the embodiment of FIG. 24, an interface chip 3100 is disposed as a lowermost layer, and memory chips 3200, 3300, 3400, and 3500 are sequentially disposed on the interface chip 3100. The interface chip 3100 may include a memory controller 2400, at least one of ECC engine and a BIST unit 2410, and a CPU 2420. The memory chips 3200, 3300, 3400, and 3500 each include anti-fuse arrays 3601, 3602, 3603, and 3604, which are non-volatile storage devices, and BIST units 3801, 3802, 3803, and 3804, respectively. A fail address of a memory chip is detected using a test device (not shown) of the interface chip 3100 and is stored in an anti-fuse array of the memory chip. These chips are connected via micro-bump (uBumps) and TSV formed therein (3701, 3702, 3703, and 3704). For example, the number of stacked chip(s) disposed on the interface chip 3100 may be one or more.

Figure 25:
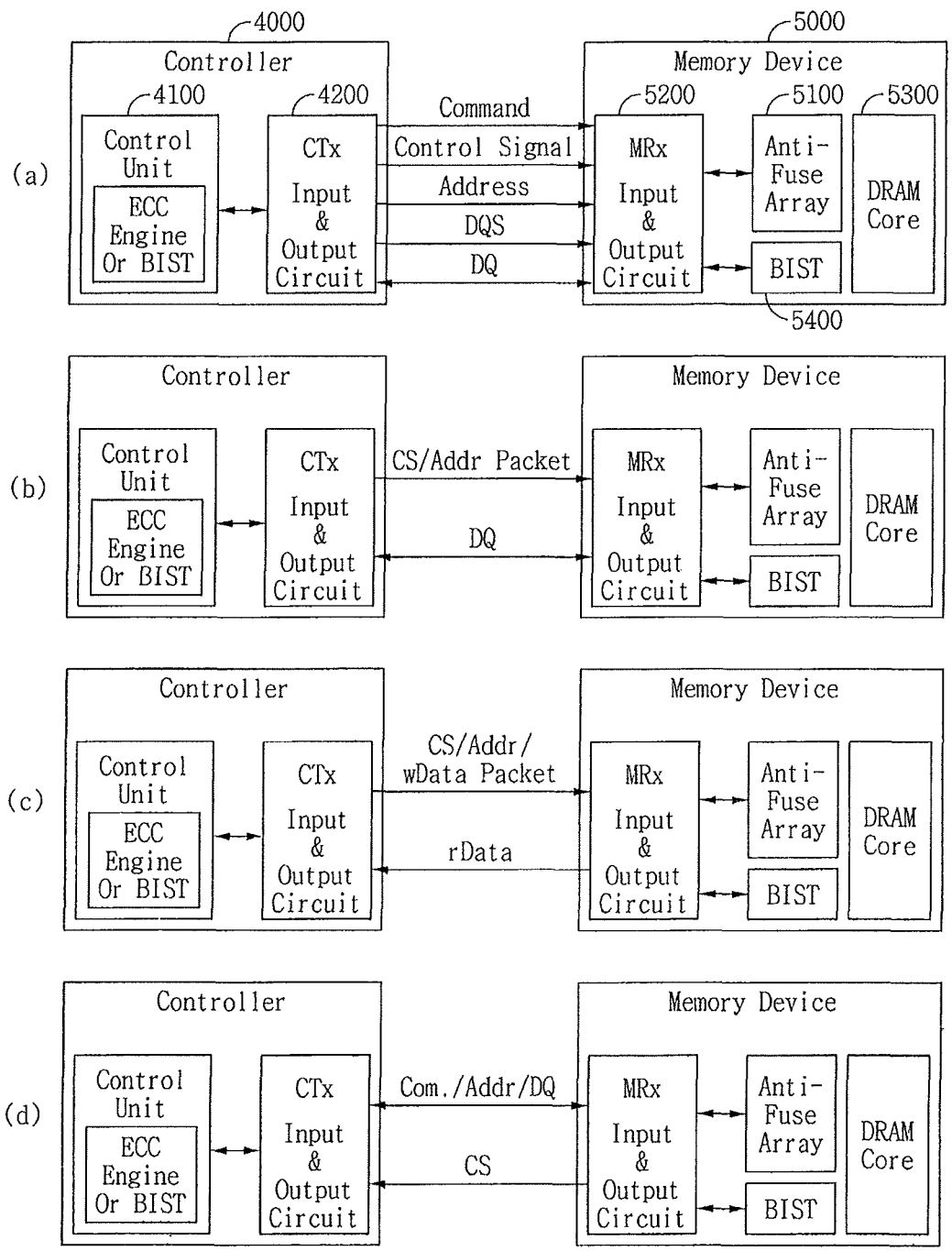
FIG. 25 illustrates an exemplary embodiment of various interfaces of a memory test system, in accordance with aspects of the inventive concept.

FIGS. 25(*a*) through 25(*d*) illustrate embodiments of various interfaces of a memory test system, in accordance with aspects of the inventive concept.

Referring to the embodiment of FIG. 25(*a*), a memory system includes a controller 4000 and a memory device 5000, with at least one communication link disposed between the two. The controller 4000 includes a control unit 4100 and an I/O circuit 4200. The control unit 4100 may include at least one of an ECC engine and a BIST unit. The memory device 5000 includes a memory (e.g., DRAM) core 5300, an anti-fuse array 5100, which is a non-volatile storage device, a BIST unit 5400, and an I/O circuit 5200. The I/O circuit 4200 of the controller 4000 includes an interface via which a command, a control signal, an address, and a data strobe DQS are transmitted to the memory device 5000 and data DQ is transmitted to and received from the memory device 5000. A fail address is also transmitted via the interface.

Referring to the embodiment of FIG. 25(*b*), an I/O circuit 4200 of a controller 4000 includes an interface via which a chip selection signal CS and an address are transmitted to a memory device 5000 using one packet and data DQ is transmitted to and received from the memory device 5000, i.e., data DQ not part of the packet. A fail address is also transmitted via the interface.

Referring to the embodiment of FIG. 25(*c*), an I/O circuit 4200 of a controller 4000 includes an interface via which a chip selection signal CS, an address, and write data wData are transmitted to a memory device 5000 using one packet and read data rData is received from the memory device 5000, i.e., rData is separately transmitted. A fail address is also transmitted via the interface.

Referring to the embodiment of FIG. 25(*d*), an I/O circuit 4200 of a controller 4000 includes an interface via which a command, an address, and data DQ are transmitted to and received from a memory device 5000 and a chip selection signal CS is received from the memory device 5000, i.e., chip selection signal CS is separately transmitted. A fail address is also transmitted via the interface.

Figure 26:
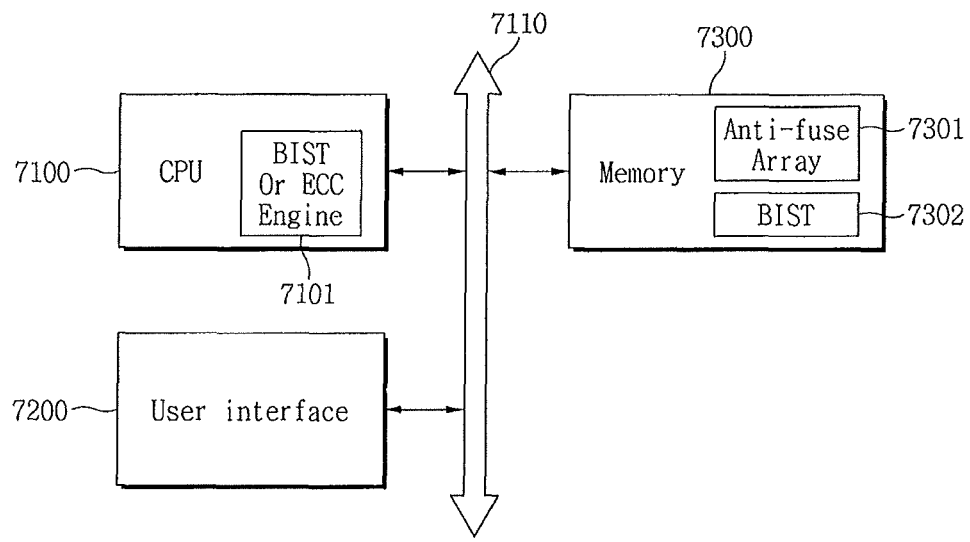
FIGS. 26 and 27 are diagrams illustrating an exemplary embodiment of system connections of a memory test system, in accordance with aspects of the inventive concept.
Figure 27:
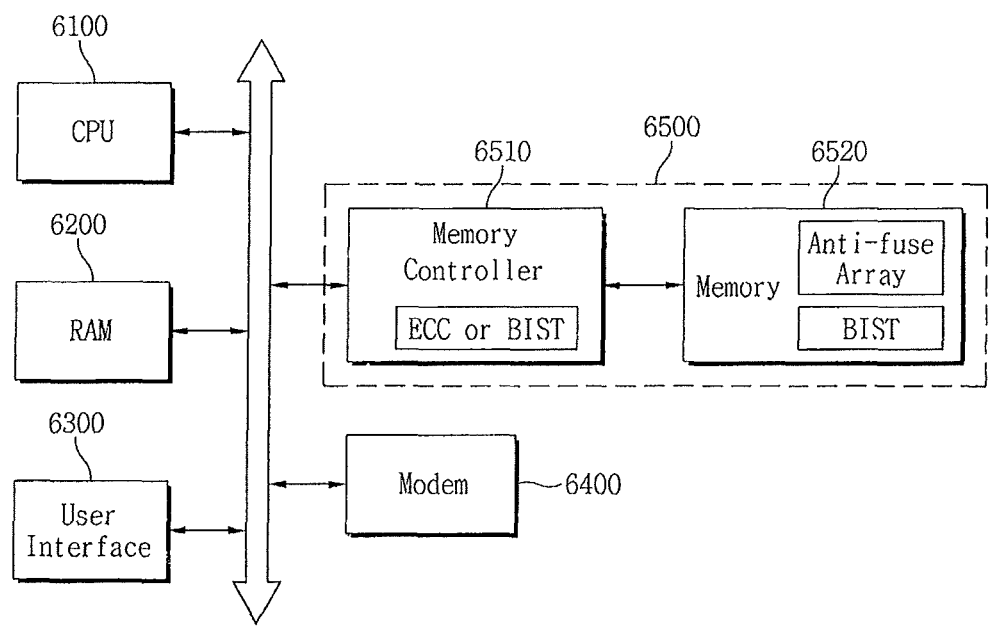

FIGS. 26 and 27 are diagrams illustrating embodiments of system connections of a memory test system, in accordance with aspects of the inventive concept.

Referring to the embodiment of FIG. 26, provided is a memory 7300 that includes an anti-fuse array 7301, which is a non-volatile memory, and a BIST unit 7302, a CPU 7100 that includes a BIST unit and/or an ECC engine 7101, and a user interface 7200. The foregoing are connected via a system bus 7110.

Referring to FIG. 27, a memory system 6500 that includes a memory 6520 having an anti-fuse array and a BIST unit, and a memory controller 6510 including a BIST and/or ECC engine, a CPU 6100, a random access memory (RAM) 6200, a user interface 6300, and a modem 6400 are connected via a system bus 6110.

A memory test device, method, and system in accordance with the inventive concept may detect a fail address of a fail memory cell included in a memory device, and fix or repair the fail memory cell by repairing the fail memory cell. Even during an operation of a chip or after chip packaging is performed, a memory device may be tested and repaired using such test device. Accordingly, malfunctions of the memory device due to a fail cell can be reduced, thereby improving the operating reliability of the memory device.

The foregoing provides illustrative embodiments and is not to be construed as limiting of the inventive concept; i.e., the inventive concept is not limited to the embodiments described herein. Although a few embodiments have been described, those skilled in the art will readily appreciate that many modifications are possible in embodiments without materially departing from the inventive concept. Accordingly, all such modifications are intended to be included within the scope of this inventive concept as defined by the claims.

What is claimed is:

1. A method of operating a dynamic random access memory (DRAM) device, the DRAM device having a memory cell array, a non-volatile memory (NVM) storage array, and a fail address memory (FAM), the method comprising:
    receiving a first mode register set command for entering into a repair mode;
    receiving an active command and a row fail address, the row fail address indicating a row of the memory cell array including at least one defective memory cell;
    storing the row fail address in the fail address memory;
    programming the row fail address in the non-volatile memory storage array;
    receiving a pre-charge command after programming the row fail address; and
    receiving a second mode register set command for exiting the repair mode after performing a pre-charge operation according to the pre-charge command.

2. The method of claim 1, wherein the non-volatile memory storage array comprises an anti-fuse array, the anti-fuse array being an m×n array, wherein m and n are natural integers equal to or greater than two.

3. The method of claim 1, wherein the memory device further includes a control unit configured to control storing row fail address in the fail address memory and outputting the row fail address from the fail address memory to the memory device for programming the row fail address in the non-volatile memory (NVM) storage array.

4. The method of claim 1, wherein the method further includes verifying the programmed row fail address whether the programmed row fail address is programmed correctly in the non-volatile memory storage array.

5. The method of claim 4, wherein the verifying the programmed row fail address includes reading the programmed row fail address from the non-volatile memory storage array and comparing the programmed row fail address memory with the received row fail address.

6. The method of claim 5, wherein the verifying the programmed row fail address is performed after programming the row fail address and before receiving the pre-charge command.

7. A method of operating a dynamic random access memory (DRAM) device, the DRAM device having a memory cell array, a non-volatile memory (NVM) storage array, and a fail address memory (FAM), the method comprising:
    receiving a first mode register set command for entering into a repair mode;
    receiving an active command and a row fail address, the row fail address indicating a row of the memory cell array including a defective memory cell;

receiving a write command and a column fail address, the column fail address indicating a column of the memory cell array including the defective memory cell;

storing the row fail address and the column fail address in the fail address memory;

programming the row fail address and the column fail address in the non-volatile memory storage array;

receiving a pre-charge command after programming the row fail address and the column fail address; and receiving a second mode register set command for exiting the repair mode after performing a pre-charge operation according to the pre-charge command.

8. The method of claim 7, wherein the non-volatile memory storage array comprises an anti-fuse array, the anti-fuse array being an m×n array, wherein m and n are natural integers equal to or greater than two.

9. The method of claim 7, wherein the memory device further includes a control unit configured to control storing row fail address in the fail address memory and outputting the row fail address from the fail address memory to the memory device for programming the row fail address in the non-volatile memory (NVM) storage array.

10. The method of claim 7, wherein the method further includes verifying whether the programmed row fail address and the programmed column fail address are programmed correctly in the non-volatile memory storage array.

11. The method of claim 10, wherein the verifying the programmed row fail address and the programmed column fail address includes reading the programmed row fail address and the programmed column fail address from the non-volatile memory storage array and comparing the programmed row fail address memory and the programmed column fail address with the received row fail address and the received column fail address respectively.

12. The method of claim 11, wherein the verifying is performed after programming the row fail address and the column fail address and before receiving the pre-charge command.

13. A memory system, comprising:
a memory controller configured to transmit a first mode register set command and an active command together with a row fail address, a pre-charge command and a second mode register set command; and a dynamic random access memory (DRAM) device, the DRAM device having a memory cell array, a non-volatile memory (NVM) storage array, and a fail address memory (FAM) and configured to:

receive the first mode register set command for entering into a repair mode;

receive the active command and the row fail address, the row fail address indicating a row of the memory cell array including at least one defective memory cell;

store the row fail address in the fail address memory;

program the row fail address in the non-volatile memory storage array;

receive the pre-charge command after programming the row fail address; and receive the second mode register set command for exiting the repair mode after performing a pre-charge operation according to the pre-charge command.

14. The memory system of claim 13, wherein the non-volatile memory storage array comprises an anti-fuse array, the anti-fuse array being an m×n array, wherein m and n are natural integers equal to or greater than two.

15. The memory system of claim 13, wherein the memory device further includes a control unit configured to control storing row fail address in the fail address memory and outputting the row fail address from the fail address memory to the memory device for programming the row fail address in the non-volatile memory (NVM) storage array.

16. The memory system of claim 13, wherein the memory device is further configured to verify the programmed row fail address whether the programmed row fail address is programmed correctly in the non-volatile memory storage array.

17. The memory system of claim 16, wherein the memory device is configured to read the programmed row fail address from the non-volatile memory storage array and to compare the programmed row fail address memory with the received row fail address during verifying the programmed row fail address.

18. The memory system of claim 17, wherein the memory device is configured to perform the verifying the programmed row fail address after programming the row fail address and before receiving the pre-charge command.

19. The memory system of claim 13, wherein the memory controller further includes a built in self test (BIST) circuit to the memory device to detect the row fail address.

20. The memory system of claim 13, wherein the memory controller further includes a error correction code (ECC) circuit for determining the row fail address.

* * * * *